US008492743B2

(12) United States Patent
Mikawa et al.

(10) Patent No.: US 8,492,743 B2
(45) Date of Patent: Jul. 23, 2013

(54) NONVOLATILE MEMORY DEVICE AND METHOD OF MANUFACTURING THE SAME

(71) Applicant: Panasonic Corporation, Osaka (JP)

(72) Inventors: Takumi Mikawa, Shiga (JP); Yoshio Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/752,601

(22) Filed: Jan. 29, 2013

(65) Prior Publication Data

US 2013/0140514 A1 Jun. 6, 2013

Related U.S. Application Data

(62) Division of application No. 13/129,215, filed as application No. PCT/JP2010/005565 on Sep. 13, 2010, now Pat. No. 8,389,972.

(30) Foreign Application Priority Data

Sep. 14, 2009 (JP) .................................. 2009-211390

(51) Int. Cl.
*H01L 29/02* (2006.01)

(52) U.S. Cl.
USPC ..... 257/4; 257/2; 257/3; 257/5; 257/E29.002; 438/102; 438/103; 438/104

(58) Field of Classification Search
USPC .... 257/2–5, E29.002; 438/102–104; 365/163
See application file for complete search history.

(56) References Cited

U.S. PATENT DOCUMENTS

| 2005/0167699 A1 | 8/2005 | Sugita et al. |
| 2007/0240995 A1 | 10/2007 | Odagawa et al. |

| 2009/0283736 A1* | 11/2009 | Kanzawa et al. ................. 257/2 |
| 2009/0321711 A1 | 12/2009 | Takagi et al. |
| 2010/0038615 A1 | 2/2010 | Nakagawa |

FOREIGN PATENT DOCUMENTS

| JP | 2006-351992 | 12/2006 |
| JP | 2007-287761 | 11/2007 |
| JP | 2008-198941 | 8/2008 |
| JP | 2010-62265 | 3/2010 |
| WO | 2005/041303 | 5/2005 |
| WO | 2008/047530 | 4/2008 |
| WO | 2008/062623 | 5/2008 |
| WO | 2008/149484 | 12/2008 |
| WO | 2010/064410 | 6/2010 |
| WO | 2010/079827 | 7/2010 |

OTHER PUBLICATIONS

International Search Report issued Dec. 21, 2010 in International (PCT) Application No. PCT/JP2010/005565.

* cited by examiner

*Primary Examiner* — Jami M Valentine
(74) *Attorney, Agent, or Firm* — Wenderoth, Lind & Ponack, L.L.P.

(57) ABSTRACT

A nonvolatile memory device includes a substrate, a lower electrode formed above said substrate, a second variable resistance layer formed above said lower electrode and comprising a second transitional metal oxide, a first variable resistance layer formed above said second variable resistance layer and comprising a first transitional metal oxide having an oxygen content that is lower than an oxygen content of the second transitional metal oxide, and an upper electrode formed above said first variable resistance layer. A step is formed in an interface between said lower electrode and said second variable resistance layer. The second variable resistance layer is formed covering the step and has a bend above the step.

12 Claims, 27 Drawing Sheets

Fig. 1
(a)
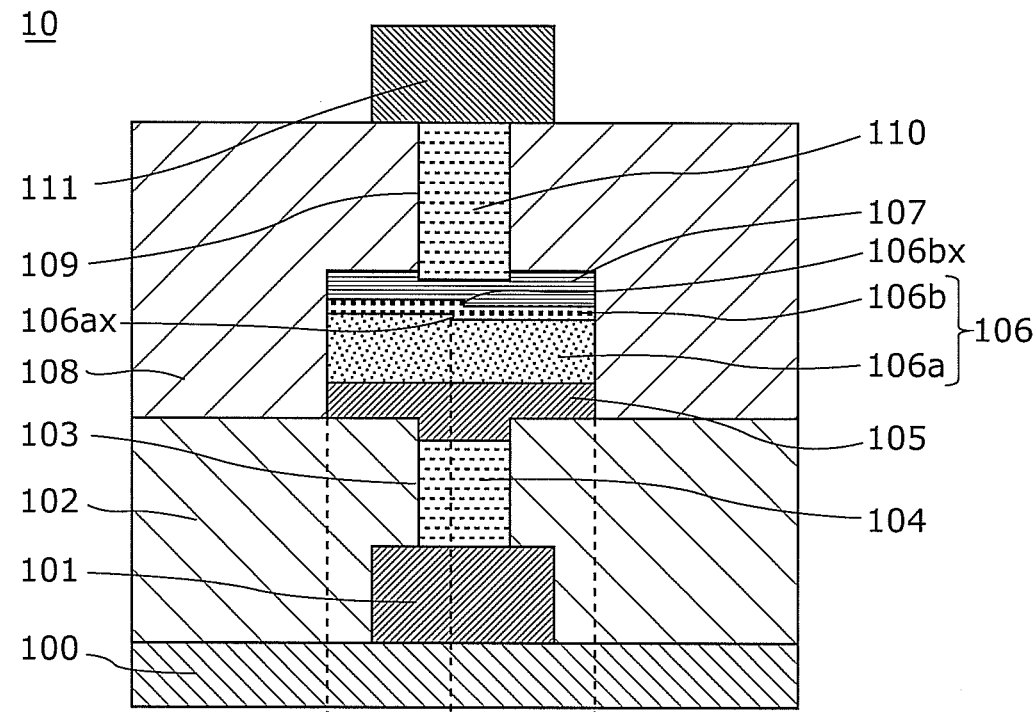
(b)
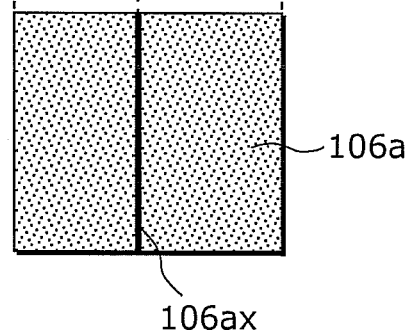

Fig. 5
(a)
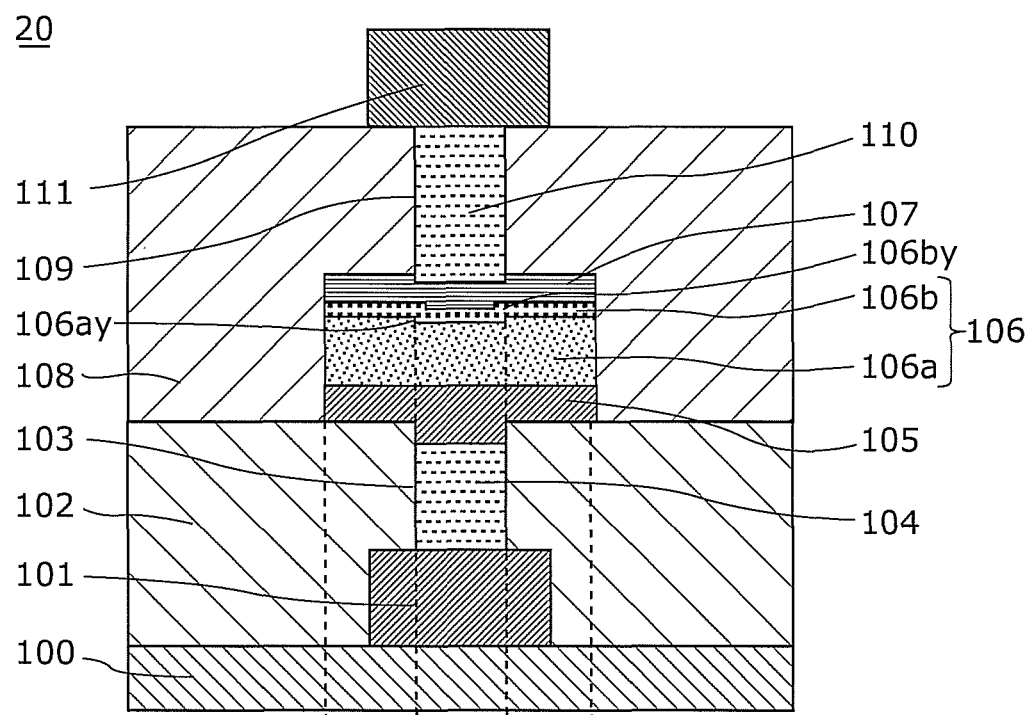
(b)
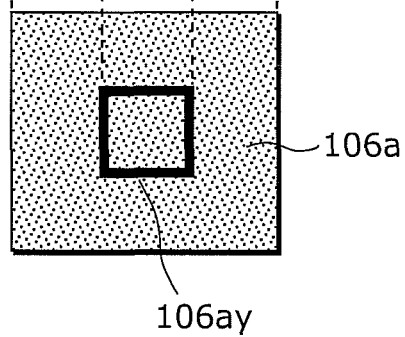

Fig. 9
(a)
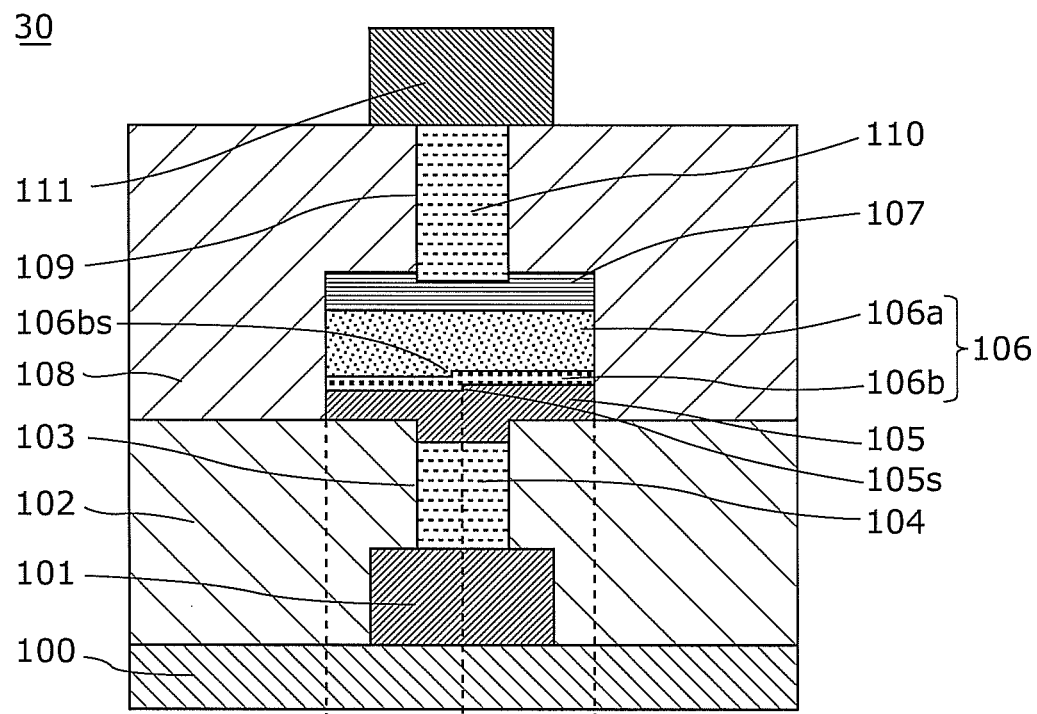
(b)
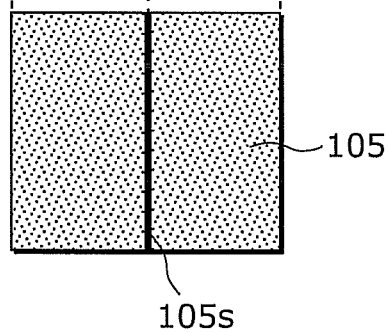

Fig. 12
(a)
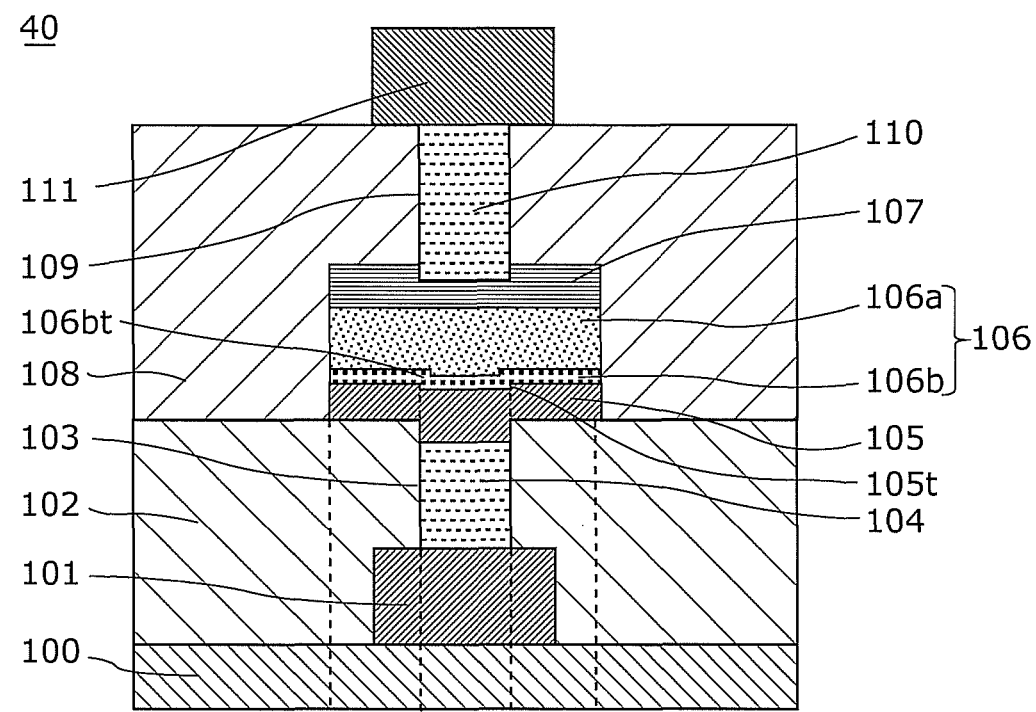
(b)
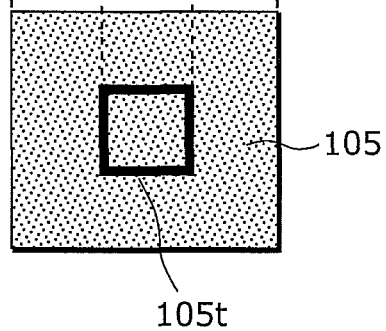

Fig. 16
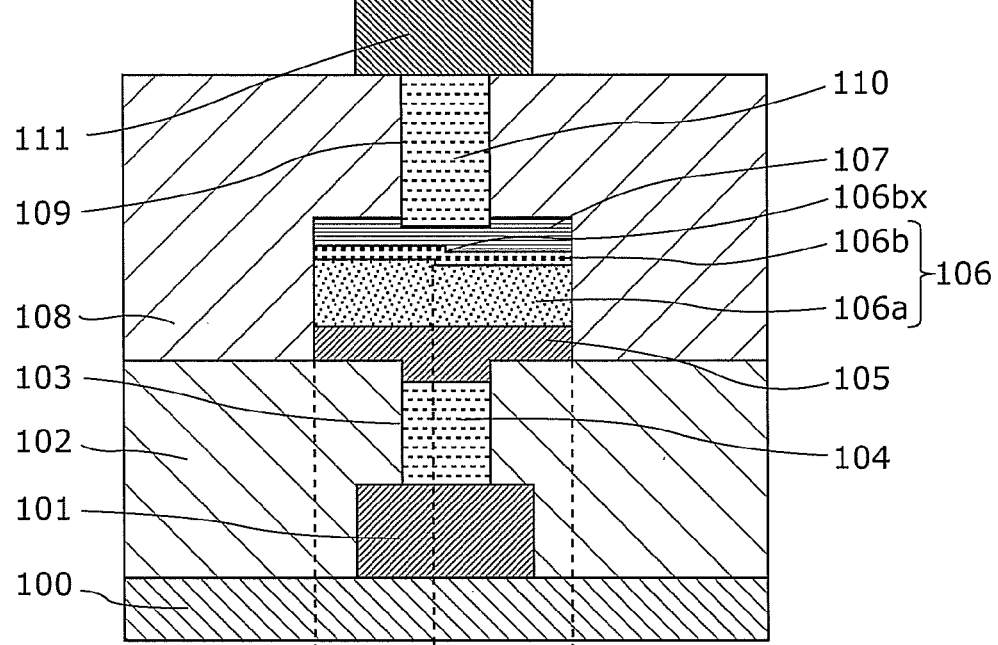
(b)
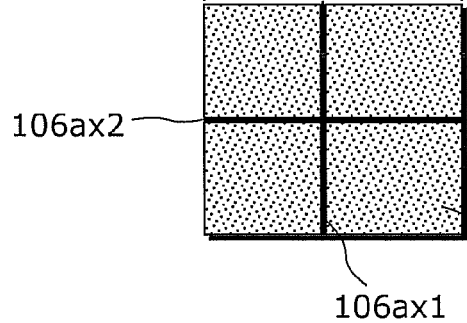
(c)
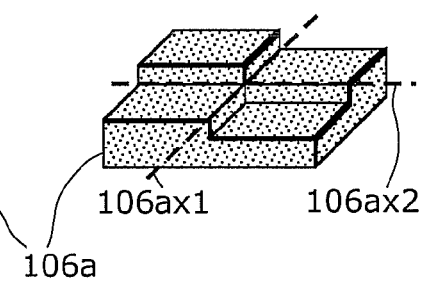

Fig. 19
(a)
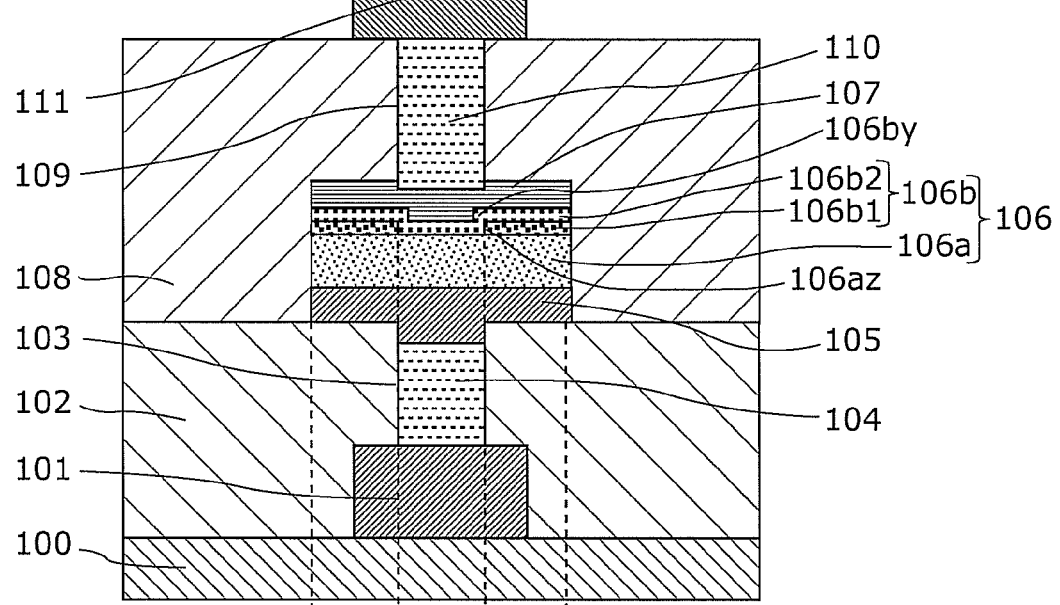
(b)
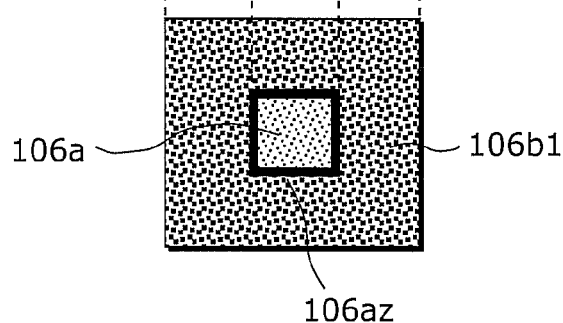

Fig. 21
(a)
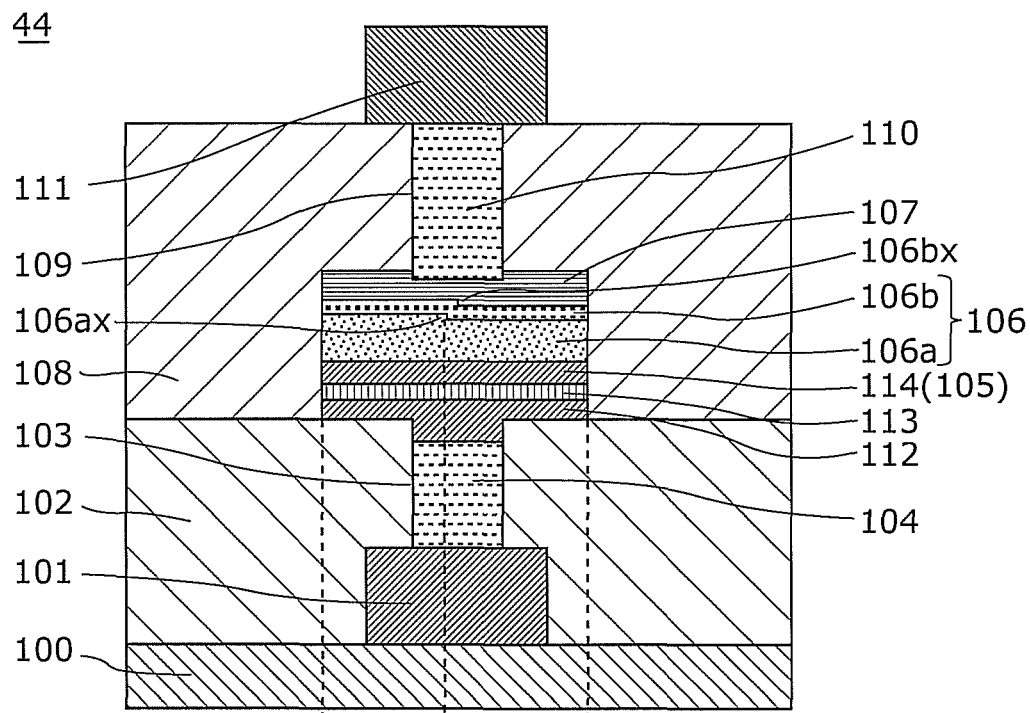
(b)
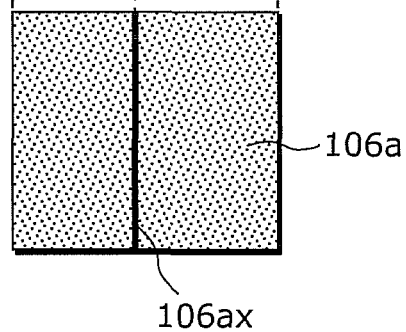

Fig. 23
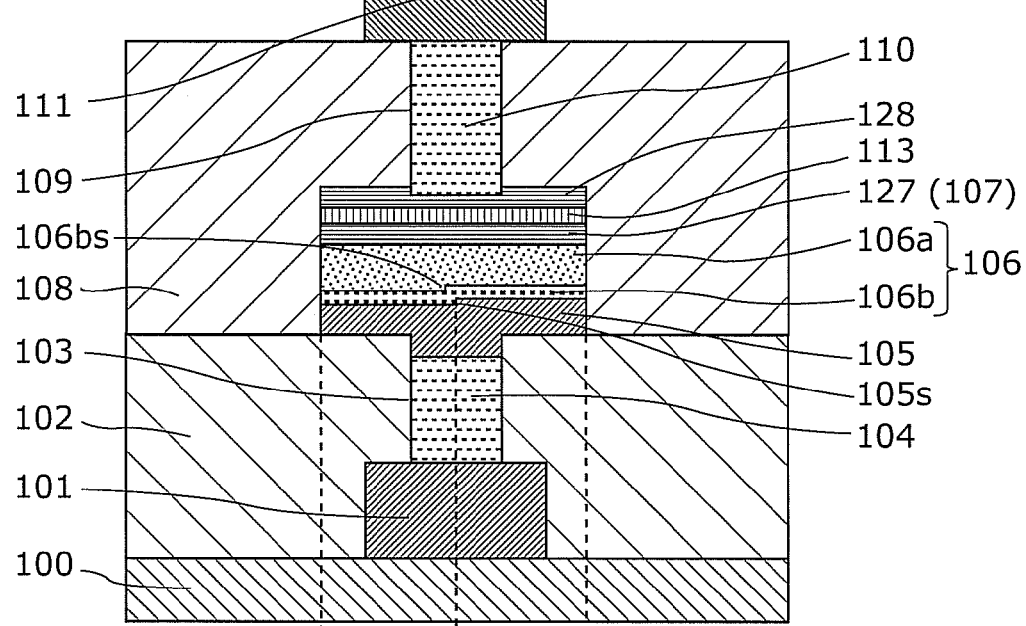
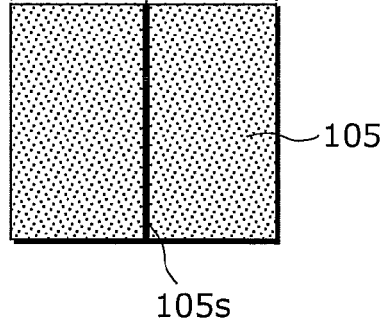

NONVOLATILE MEMORY DEVICE AND METHOD OF MANUFACTURING THE SAME

TECHNICAL FIELD

The present invention relates to a variable resistance nonvolatile memory device which has a resistance value that changes according to application of voltage pulse.

BACKGROUND ART

Recent years have seen increasing high performance in electronic devices such as mobile information devices and information appliances following the development of digital technology. With the increased high performance in these electronic devices, miniaturization and increase in speed of semiconductor elements used are rapidly advancing. Among these, application for large-capacity nonvolatile memories represented by a flash memory is rapidly expanding. In addition, as a next-generation new-type nonvolatile memory to replace the flash memory, research and development on a variable resistance nonvolatile storage element which uses what is called a variable resistance element is advancing. Here, variable resistance element refers to an element having a property in which a resistance value reversibly changes according to electrical signals, and capable of storing information corresponding to the resistance value in a nonvolatile manner.

As an example of such variable resistance element, there is proposed a nonvolatile memory device having a variable resistance layer in which transition metal oxides of different oxygen content are stacked. For example, Patent Literature 1 discloses selectively causing the occurrence of oxidation/reduction reaction in an electrode interface which is in contact with a variable resistance layer having high oxygen content, to stabilize resistance change.

The aforementioned conventional variable resistance element includes a lower electrode, a variable resistance layer, and an upper electrode, and a memory array is configured from a two-dimensional or three-dimensional array of such variable resistance element. In each of the variable resistance elements, the variable resistance layer is of a stacked structure including a first variable resistance layer and a second variable resistance layer, and, in addition, the first and second variable resistance layers comprise the same type of transitional metal oxide. The oxygen content of the transitional metal oxide comprised in the second variable resistance layer is higher than the oxygen content of the transitional metal oxide comprised in the first variable resistance layer. By adopting such a structure, when voltage is applied to the variable resistance element, most of the voltage is applied to the second variable resistance layer which has higher oxygen content and exhibits a higher resistance value. Furthermore, oxygen, which can contribute to the reaction, is abundant in the vicinity of the interface. Therefore, oxidation/reduction reaction occurs selectively at the interface between the upper electrode and the second variable resistance layer, and stable resistance change can be realized.

CITATION LIST

Patent Literature

[PTL 1]
International Publication No. 2008/149484

SUMMARY OF INVENTION

Technical Problem

However, in the above-described conventional variable resistance nonvolatile memory device, there is the problem that the break voltage to be initially applied to the variable resistance element in order to transition to a state in which resistance change is started is high, and that the break voltage varies for each variable resistance element included in the memory array.

The present invention is conceived to solve the aforementioned problem and has as an object to provide (i) a variable resistance nonvolatile memory device capable of reducing break voltage compared to the conventional device, and suppressing variation of break voltage among respective variable resistance elements, and (ii) a manufacturing method thereof.

Solution to Problem

In order to achieve the aforementioned object, a first nonvolatile memory device according to an aspect of the present invention includes: a substrate; a lower electrode formed above the substrate; a first variable resistance layer formed above the lower electrode and comprising a first transitional metal oxide; a second variable resistance layer formed above the first variable resistance layer and comprising a second transitional metal oxide having an oxygen content that is higher than an oxygen content of the first transitional metal oxide; and an upper electrode formed above the second variable resistance layer, wherein a step is formed in an interface between the first variable resistance layer and the second variable resistance layer, and the second variable resistance layer is formed covering the step and has a bend above the step. Here, the bend refers to a part at which the second variable resistance layer bends in the stacking direction due to the influence of an abrupt step formed in the base, and does not include a bend caused by a gradually-changing, gentle step shape. By adopting the above-described configuration, the shape of the step of the first variable resistance layer is reflected, thereby forming the bend in the second variable resistance layer on the step, and thus it is possible, through electric field concentration, to cause the break phenomenon even with a low voltage, with the bend as a starting point of the initial break. Furthermore, since the shape of the step can be formed with intentional control, the shape of the bend of the second variable resistance layer becomes stable, and thus variation in break voltage does not increase. Therefore, lowering the break voltage and suppressing variation therein can both be achieved, and miniaturization and increased capacity of memories can be realized.

Furthermore, it is preferable that the first nonvolatile memory device include a contact plug below the lower electrode, and that an interface between the lower electrode and the first variable resistance layer be flat. By adopting such a configuration, even though a recess is created above the contact plug, the lower electrode above such recess is thick, and thus the surface of the electrode can be made flat. The shape and film thickness of the second variable resistance layer at the bend is dependent only on the shape of the step of the first variable resistance layer, and is not affected by the shape of the base in a further lower layer. Thus, it is possible to reduce variation in resistance change characteristics between each bit caused by the base.

In order to achieve the aforementioned object, a second nonvolatile memory device according to an aspect of the present invention includes: a substrate; a lower electrode formed above the substrate; a second variable resistance layer formed above the lower electrode and comprising a second transitional metal oxide; a first variable resistance layer formed above the second variable resistance layer and comprising a first transitional metal oxide having an oxygen content that is lower than an oxygen content of the second transitional metal oxide; and an upper electrode formed above the first variable resistance layer, wherein a step is formed in an interface between the lower electrode and the second variable resistance layer, and the second variable resistance layer is formed covering the step and has a bend above the step. By adopting such a configuration, the shape of the step of the lower electrode is reflected, thereby forming the bend in the second variable resistance layer on the step, and thus it is possible, through electric field concentration, to cause the break phenomenon even with a low voltage, with the bend as a starting point of the initial break. Furthermore, since the shape of the step can be formed with intentional control, the shape of the bend of the second variable resistance layer becomes stable, and thus variation in break voltage does not increase. Therefore, lowering the break voltage and suppressing variation therein can both be achieved, and miniaturization and increased capacity of memories can be realized.

In the first and second nonvolatile memory devices described above, the bend of the second variable resistance layer is straight-shaped when the second variable resistance layer is seen from above. By adopting such a configuration, straight step patterns can be formed in the first variable resistance layers or lower electrodes across a plurality of adjacent variable resistance elements, in the same pattern, and thus miniaturization does not pose a problem in the forming of the straight step pattern. Therefore, since a low-cost mask can be used, manufacturing cost reduction becomes possible, and the manufacturing method for forming the straight step patter is simplified.

Furthermore, in the first and second nonvolatile memory devices described above, the bend of the second variable resistance layer may be ring-shaped when the second variable resistance layer is seen from above. By adopting such a configuration, a longer step pattern can be formed in a single variable resistance element than with the straight step pattern. As such, the length of the bend of the second variable resistance layer can be extended, and due to the increase in the region serving as a starting point of the break phenomenon, further lowering of the break voltage becomes possible. Furthermore, depending on the case, it is possible to share with a mask for forming contact holes above and below the variable resistance element, and thus reduction of manufacturing cost becomes possible.

Furthermore, in the first and second nonvolatile memory devices described above, the step of the first variable resistance layer may include plural steps, and there may be a crossing point at which the plural steps cross each other. By adopting such a configuration, the step is biggest at the crossing point at which the steps cross, and the bend becomes bigger in the second variable resistance layer formed on the step, and thus the second variable resistance layer tends to be a locally thin-film. Therefore, the electric field is easily concentrated at the crossing point, and thus allowing the location of the break phenomenon to be fixed. Therefore, by placing the crossing point at the central part of the variable resistance element and away from the edges of the variable resistance element, a filament can be formed at a part that is minimally affected by etching damage and an oxidized region of a layer insulating film and the like. Therefore, variation in resistance change characteristics is greatly reduced, and thus it is possible to realize a nonvolatile memory device having little bit variation and excellent manufacturing yield.

In the first and second nonvolatile memory devices described above, the first variable resistance layer and the second variable resistance layer may each comprise an oxide layer of tantalum, hafnium, or zirconium. These materials have excellent retention characteristics for variable resistance elements and are materials that allow high-speed operation, and thus the advantageous effects of the present invention allow break characteristics to be made extremely stable even for a variable resistance layer material that requires an initial break at the start of resistance change.

In the first and second nonvolatile memory devices described above, a diode element may be formed in contact with the lower electrode or the upper electrode of the variable resistance element. In a memory cell structure in which the variable resistance element and the diode element are connected in series, it is necessary to add a voltage portion to be distributed to the diode element and raise the voltage to be applied to the memory cell, and thus the demand for lowering the voltage becomes greater. In the nonvolatile memory device in the present embodiment, the break voltage of the variable resistance element can be lowered, and thus the voltage applied to the memory cell can be lowered. Furthermore, since the break phenomenon of the variable resistance element occurs locally, transient current flowing at the time of the break can be reduced. With this, destruction of the diode element can also be prevented.

The first method of manufacturing a nonvolatile memory device according to an aspect of the present invention includes: forming a lower electrode above a substrate; forming a first variable resistance layer above the lower electrode, the first variable resistance layer comprising a first transitional metal oxide; forming a step in a surface of the first variable resistance layer; forming a second variable resistance layer to cover the step of the first variable resistance layer and have a bend above the step, the second variable resistance layer comprising a second transitional metal oxide having an oxygen content that is higher than an oxygen content of the first transitional metal oxide; and forming an upper electrode above the second variable resistance layer.

Furthermore, the second method of manufacturing a nonvolatile memory device according to an aspect of the present invention includes: forming a lower electrode above a substrate; forming a step in a surface of the lower electrode; forming a second variable resistance layer to cover the step of the lower electrode and have a bend above the step, the second variable resistance layer comprising a second transitional metal oxide; forming a first variable resistance layer above the second variable resistance layer, the first variable resistance layer comprising a first transitional metal oxide having an oxygen content that is lower than an oxygen content of the second transitional metal oxide; and forming an upper electrode above the first variable resistance layer.

By adopting such a manufacturing method, it is possible to reflect the shape of the step of the base and stably form the bend in the second variable resistance layer on the step, and thus it is possible, through electric field concentration, to cause the break phenomenon even with a low voltage, with the bend as a starting point of the initial break. Furthermore, since the shape of the step can be formed with intentional control, the shape of the bend of the second variable resistance layer becomes stable, and thus variation in break voltage does not increase. Therefore, lowering the break voltage and suppressing variation therein can both be achieved, and miniaturization and increased capacity of memories can be realized.

Furthermore, the third method of manufacturing a first nonvolatile memory device according to an aspect of the present invention includes: forming a lower electrode above a substrate; forming a first variable resistance layer above the lower electrode, the first variable resistance layer comprising a first transitional metal oxide; forming a second variable resistance layer above the first variable resistance layer, the second variable resistance layer comprising a second transitional metal oxide having an oxygen content that is higher than an oxygen content of the first transitional metal oxide; additionally stacking the second variable resistance layer after forming a step in the second variable resistance layer, so as to cover the step; and forming an upper electrode above the additionally-stacked second variable resistance layer.

By adopting such a manufacturing method, a thin-film region where electric fields easily concentrate can be formed in the second variable resistance layer, and thus it is possible to cause the break phenomenon even with a low voltage, with the thin-film region as a starting point of the initial break. Furthermore, since the shape of the step can be formed with intentional control, variation in the film thickness of the second variable resistance layer can be stabilized, and thus variation in break voltage does not increase. Therefore, lowering the break voltage and suppressing variation therein can both be achieved, and miniaturization and increased capacity of memories can be realized.

Advantageous Effects of Invention

The nonvolatile memory device in the present invention lowers break voltage and reduces variation in break voltage by intentionally forming a step in the surface of a base layer of the second variable resistance layer and thereby stably forming a locally thin-filmed or bent part in the second variable resistance layer on the step. By being able to lower the break voltage and ameliorate the variation in bit-units, the present invention can contribute significantly to miniaturization and increased capacity of memories.

BRIEF DESCRIPTION OF DRAWINGS

FIG. 1 (*a*) is a cross-sectional view showing an example configuration of a nonvolatile memory device in Embodiment 1 of the present invention, and FIG. 1 (*b*) is a plan view of a first variable resistance layer included in the nonvolatile memory device.

FIG. 5 (*a*) is a cross-sectional view showing an example configuration of a nonvolatile memory device in Embodiment 2 of the present invention, and FIG. 5 (*b*) is a plan view of a first variable resistance layer included in the nonvolatile memory device.

FIG. 9 (*a*) is a cross-sectional view showing an example configuration of a nonvolatile memory device in Embodiment 3 of the present invention, and FIG. 9 (*b*) is a plan view of a lower electrode included in the nonvolatile memory device.

FIG. 12 (*a*) is a cross-sectional view showing an example configuration of a nonvolatile memory device in Embodiment 4 of the present invention, and FIG. 12 (*b*) is a plan view of a lower electrode included in the nonvolatile memory device.

FIG. 16 (*a*) is a cross-sectional view showing an example configuration of a nonvolatile memory device in Embodiment 5 of the present invention, FIG. 16 (*b*) is a plan view of a first variable resistance layer included in the nonvolatile memory device, and FIG. 16 (*c*) is a perspective view of the first variable resistance layer included in the nonvolatile memory device.

FIG. 19 (*a*) is a cross-sectional view showing an example configuration of a nonvolatile memory device in Embodiment 6 of the present invention, and FIG. 19 (*b*) is a plan view of a first variable resistance layer included in the nonvolatile memory device.

FIG. 21 (*a*) is a cross-sectional view showing an example configuration of a nonvolatile memory device in Embodiment 7 of the present invention, and FIG. 21 (*b*) is a plan view of a first variable resistance layer included in the nonvolatile memory device.

FIG. 23 (*a*) is a cross-sectional view showing an example configuration of a nonvolatile memory device in a modification of Embodiment 7 of the present invention, and FIG. 23 (*b*) is a plan view of a first variable resistance layer included in the nonvolatile memory device.

DESCRIPTION OF EMBODIMENTS

Hereinafter, results of experiments by the inventors showing variation in break voltages and the cause thereof shall be described prior to describing the details of the present invention.

Figure 24:
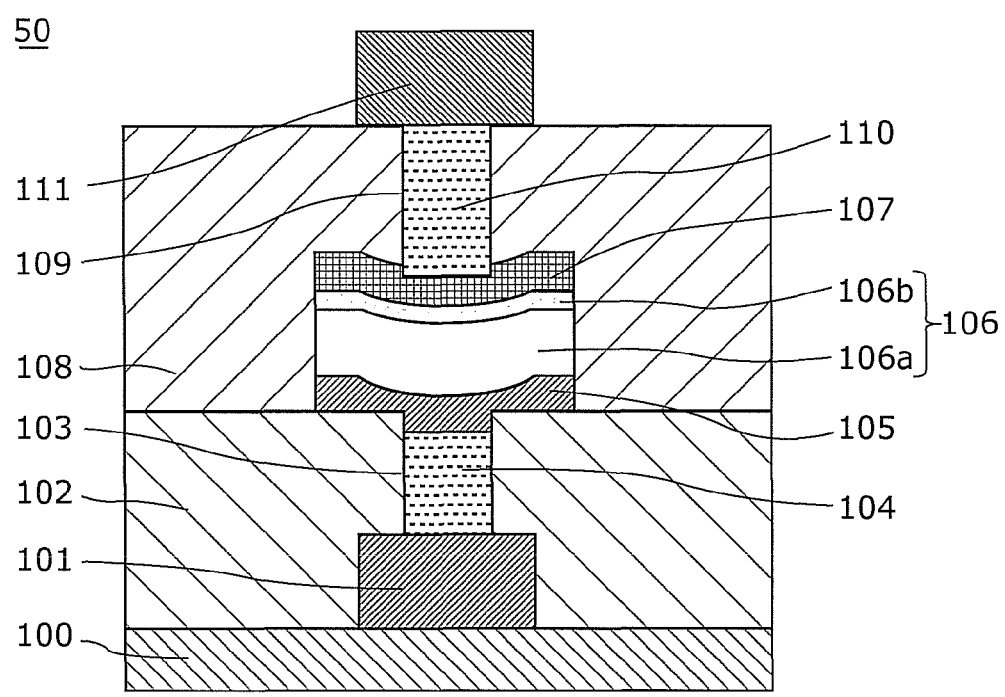
FIG. 24 is a cross-sectional view showing an example configuration of a nonvolatile memory device in a first comparative example.

FIG. 24 shows, as a first comparative example, a variable resistance nonvolatile memory device 50 provided with a variable resistance element. As shown in FIG. 24, a first line 101 is formed on a substrate 100, and a first interlayer insulating layer 102 is formed covering the first line 101. A first contact hole 103 is formed penetrating through the first interlayer insulating layer 102 and reaching the first line 101, and a first contact plug 104 is formed filling the first contact hole 103. A variable resistance element including a lower electrode 105, a variable resistance layer 106, and an upper electrode 107 is formed on the first interlayer insulating layer 102 and covering the first contact plug 104. A second interlayer insulating layer 108 is formed covering the variable resistance element, and a second contact plug 110 is formed filling the a second contact hole 109 which penetrates through the second interlayer insulating layer 108, to connect the upper electrode 107 and a second line 111. The variable resistance layer 106 is configured of the stacked structure of a first variable resistance layer 106a and a second variable resistance layer 106b. The first variable resistance layer 106a and the second variable resistance layer 106b comprise the same type of transitional metal oxide, and the oxygen content of the transitional metal oxide forming the second variable resistance layer 106b is higher than the oxygen content of the transitional metal oxide forming the first variable resistance layer 106a.

By adopting such a structure, when voltage is applied to the variable resistance element, most of the voltage is applied to the second variable resistance layer 106b which has higher oxygen content and exhibits a higher resistance value. Furthermore, oxygen which can contribute to reaction is abundant in the vicinity of the interface between the upper electrode 107 and the second variable resistance layer 106b. Therefore, oxidation/reduction reaction occurs selectively at the interface between the upper electrode 107 and the second variable resistance layer 106b, and stable resistance change can be realized.

Figure 25:
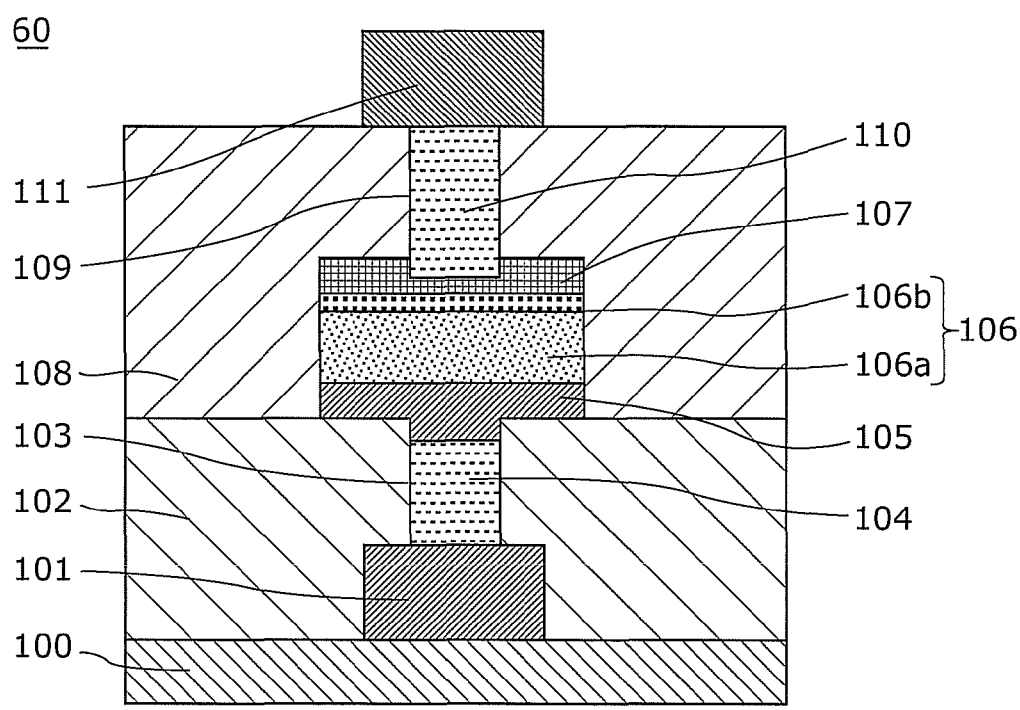
FIG. 25 is a cross-sectional view showing an example configuration of a nonvolatile memory device in a second comparative example.

Furthermore, FIG. 25 shows, as a second comparative example, a variable resistance nonvolatile memory device 60 provided with a variable resistance element. As shown in FIG. 25, the difference between the nonvolatile memory device 50 in FIG. 24 and the nonvolatile memory device 60 is that the surface of the lower electrode 105 is planarized. The top plane of the first contact plug 104 and the top plane of the first interlayer insulating layer 102 are not continuous and, although a recess (5 to 50 nm) is created in the non-continuous part, the lower electrode 105 is also formed in the part of the recess created above the first contact plug 104 inside the first contact hole 103, and the surface of the lower electrode 105 is flat. In this manner, since the lower electrode 105 is also found inside the recess part created above the first contact plug 104, the thickness of the lower electrode 105 above the recess becomes thicker than the thickness above the first interlayer insulating layer 102 as a result. According to this structure, since satisfactory flatness can be achieved for the surface of the lower electrode 105, it is possible to suppress variations in the shape and film thickness of the variable resistance layer 106 formed on the lower electrode 105, and reduce variation in resistance change characteristics. Most of all, since the variation in film thickness of the second variable resistance layer 106b, which has a thin film thickness, high oxygen content, and high resistance, is suppressed and the initial break operation for causing a resistance change (operation of locally short-circuiting a part of the second variable resistance layer 106b, and causing a transition to the state where resistance change is to be started) becomes stable, it is possible to significantly reduce variation among respective bits and realize a large-capacity nonvolatile memory.

Figure 26A:
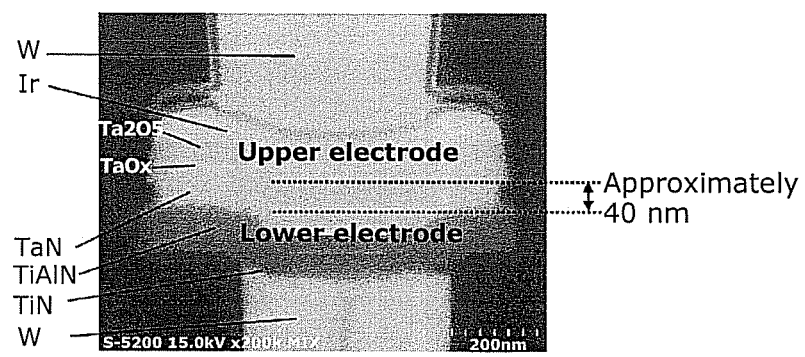
FIG. 26A is a SEM image cross-sectional view of the nonvolatile memory device in the first comparative example.
Figure 26B:
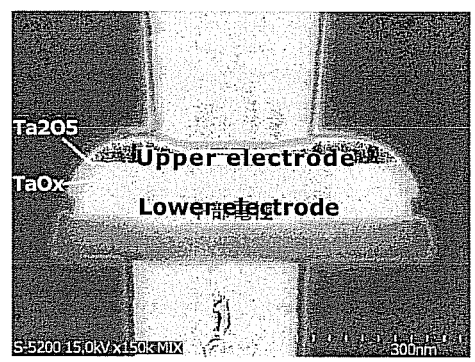
FIG. 26B is a SEM image cross-sectional view of the nonvolatile memory device in the second comparative example.

FIG. 26A and FIG. 26B show specific configuration examples corresponding to the structures in FIG. 24 and FIG. 25, respectively. FIG. 26A is a SEM photograph cross-sectional view of an actually test-manufactured variable resistance element of the nonvolatile memory device 50 which is the first comparative example described above, and FIG. 26B is a SEM photograph cross-sectional view of an actually test-manufactured variable resistance element of the nonvolatile memory device 60 which is the second comparative example. In both trial products, the first contact plug 104 is made of tungsten (W), and the lower electrode 105 is configured of a stacked structure of, from the top plane, tantalum nitride (TaN), titanium aluminum nitride (TiAlN), and titanium nitride (TiN). Furthermore, the variable resistance layer 106 comprises a tantalum oxide, the first variable resistance layer 106a having an oxygen content that is relatively closer to the stoichiometric composition comprises oxygen-deficient $TaO_x$ ($0<x<2.5$), and the second variable resistance layer 106b having an oxygen content that is relatively high with respect to the first variable resistance layer 106a comprises an oxide having a composition that is close to $Ta_2O_5$. The upper electrode 107 comprises iridium (Ir), and the second contact plug 110 comprises tungsten (W). As shown in FIG. 26A, in the nonvolatile memory device 50, a recess is created on the first contact plug 104, which affects the shape of the lower electrode 105, and thus a depression of approximately 40 nm is created in the surface of the lower electrode 105. Therefore, the variable resistance layer 106 formed above the depression is sunken at the central part, and is slightly thinner at the central part. In particular, since the second variable resistance layer 106b, to which voltage is effectively applied when voltage is applied to the element, is thin at only a few nm, variations in the shape and film thickness thereof affect the variation in resistance change characteristics. On the other hand, as shown in FIG. 26B, since the nonvolatile memory device 60 is formed such that the surface of the lower electrode 105 is flat, both the first variable resistance layer 106a and second variable resistance layer 106b formed above the lower electrode 105 have a flat shape and there is very little variation in film thickness.

Figure 27:
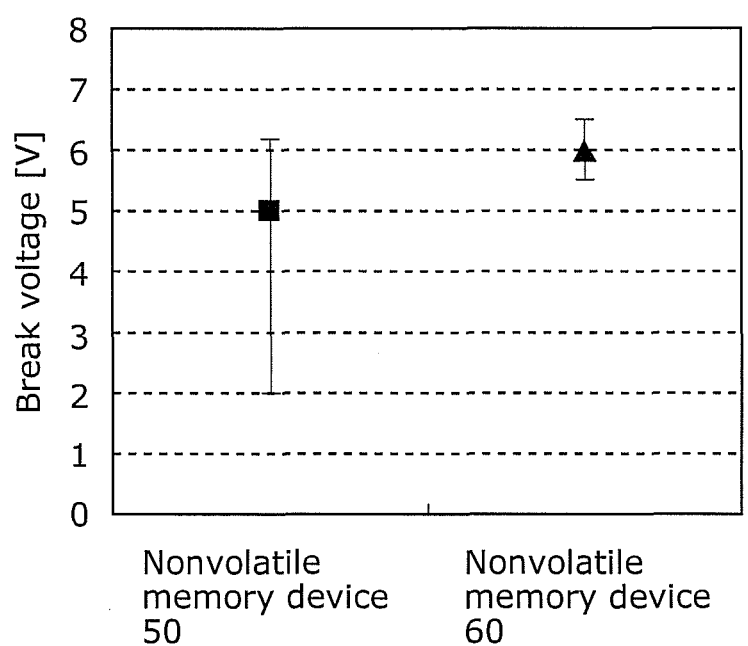
FIG. 27 is a graph showing break voltage characteristics of the nonvolatile memory devices in the first and second comparative examples.

FIG. 27 is a graph (error bars show largest value and smallest value) showing the initial break voltages of the above described nonvolatile memory devices 50 and 60. "Initial break" refers to the localized short-circuiting of a part of the second variable resistance layer 106b having a higher oxygen content and exhibiting a higher resistance value to cause transition to a state where resistance change can start, when voltage is initially applied to the variable resistance element immediately after manufacturing (also the same hereafter). The graph evaluates the initial break voltage required when the variable resistance element and a load resistance of 5 kΩ are connected in series. In the nonvolatile memory device 50, significant variation of 2 to 6 V (average value of 5 V) can be seen in the break voltage. This suggests a variation in the direction of the thinning of the film thickness or the localized short-circuiting of the second variable resistance layer 106b due to the creation of the recess and the variation in the recess amount (0 to 50 nm). On the other hand, in the nonvolatile memory device 60, variation in break voltage is suppressed but the absolute value thereof is high at more or less 6 V. Here, it is considered that variation in break voltage is suppressed by the adoption of the structure in which variation in the film thickness of the second variable resistance layer 106b is not easily affected even when the amount of recess varies. However, on the other hand, it is considered that the break voltage becomes high since the presence of a locally thinned-out part and a bent part in the second variable resistance layer 106b have been eliminated, that is, the location in which breaking can take place easily is eliminated.

The present invention solves the above-described problem and lowers the initial break voltage and variations therein by stably forming a locally thin or bent part in the second variable resistance layer by intentionally forming a step in the surface of the first variable resistance layer or the lower electrode which serve as a base of the second variable resistance layer which determines the initial break characteristics. In particular, being able to lower initial break voltage and ameliorate variation between bits can contribute significantly to miniaturization and increased capacity of memories. In other words, the present invention can provide a variable resistance nonvolatile memory device suited for increased capacity and a method of manufacturing the same.

Hereinafter, embodiments of the present invention shall be described with reference to the Drawings.

Embodiment 1

Device Configuration

FIG. 1 (*a*) is a cross-sectional view of a nonvolatile memory device 10 in Embodiment 1 of the present invention, and FIG. 1 (*b*) is a plan view of the first variable resistance layer 106a included therein. It should be noted that, hereinafter, a cross-sectional view refers to a diagram of the inside of a plane including a line parallel to the stacking direction of a variable resistance element, and a plan view refers to a view seen from the stacking direction of the variable resistance element.

As shown in FIGS. 1 (*a*) and (*b*), the nonvolatile memory device in Embodiment 1 includes: the substrate 100 which is a semiconductor substrate, and the like, on which the first line 101 is formed; the first interlayer insulating layer 102 comprising a silicon oxide film (film thickness: 500 to 100 nm) formed on the substrate 100 and covering the first line 101; and the first contact plug 104 having tungsten (W) as a primary component, formed by being filled into the first contact hole 103 (diameter: 50 to 300 nm) which penetrates through the first interlayer insulating layer 102 and reaches the first line 101. The top plane of the first contact plug 104 and the top plane of the first interlayer insulating layer 102 are not continuous (that is, not on the same plane), and a recess (depth: 5 to 50 nm) is created in the non-continuous part. In addition, a variable resistance element (500 nm square size), which includes: the lower electrode 105 (film thickness: 5 to 100 nm) comprising tantalum nitride (TaN); the variable resistance layer 106 (film thickness: 20 to 100 nm); and the upper electrode 107 (film thickness: 5 to 100 nm) comprising a noble metal (platinum (Pt), iridium (Ir), palladium (pd), and the like), is formed on the first interlayer insulating layer 102 and covering the first contact plug 104. The second interlayer insulating layer 108 comprising a silicon oxide film (SiO, film thickness: 500 to 1000 nm) is formed covering the variable resistance element, the second contact hole 109 (diameter: 50 to 300 nm) is formed penetrating through the second interlayer insulating layer 108 and reaching the upper electrode 107, and the second contact plug 110 having tungsten (W) as a primary component is formed inside the second contact hole 109. The second line 111 is formed on the second interlayer insulating layer 108 and covering the second contact plug 110. It should be noted that the step created on the first contact plug 104 is not transferred onto the surface of the lower electrode 105, and thus the lower electrode 105 is extremely flat throughout the entire surface, and a continuous plane (flat plane) is maintained. Therefore, although the nonvolatile memory device 10 includes the first contact plug 104 below the lower electrode 105, the interface between the lower electrode 105 and the first variable resistance layer 106a is flat.

Here, the variable resistance layer 106 is configured of the stacked structure of the first variable resistance layer 106a (film thickness: 18 to 95 nm) and the second variable resistance layer 106b (film thickness: 2 to 10 nm). The first variable resistance layer 106a comprises a first transitional metal oxide which is a transitional metal oxide having, for example, an oxygen-deficient tantalum oxide (TaO$_x$, 0<x<2.5) as a primary component. The oxygen content of a second transitional metal oxide forming the second variable resistance layer 106b is higher than the oxygen content of the first transitional metal oxide forming the first variable resistance layer 106a. Stated differently, the oxygen composition ratio of the second transitional metal oxide is higher than the oxygen composition ratio of the first transitional metal oxide. For example, assuming that the second variable resistance layer 106b comprises a tantalum oxide (TaO$_y$), then x<y. When the first variable resistance layer 106a and the second variable resistance layer 106b comprise a transitional metal oxide other than tantalum, the first variable resistance layer 106a and the second variable resistance layer 106b comprise a material having a less degree of oxygen deficiency from the stoichiometric composition exhibiting insulating properties. It is possible to configure a variable resistance film of the same stacked structure even when an oxide such as hafnium (Hf) or zirconium (Zr) is used as another material comprised in the variable resistance layer 106.

It should be noted that an oxygen-deficient transitional metal oxide refers to an oxide having less oxygen content (atom number ratio: percentage of total number of atoms occupied by oxygen atoms) compared to an oxide including a stoichiometric composition. When the transitional metal is Ta, the composition of a stoichiometric oxide is Ta$_2$O$_5$, and the proportion of the number of atoms of Ta and O is 2.5. Therefore, in an oxygen-deficient Ta oxide, the atom proportion of Ta and 0 is greater than 0 and less than 2.5.

A straight step 106ax (height: 1 to 30 nm, length 500 nm) such as that shown in FIG. 1 (*b*) is formed in the surface (the interface with the second variable resistance layer 106b) of the first variable resistance layer 106a, and the second variable resistance layer 106b is formed above, covering the step 106ax. A straight bend 106bx of the second variable resistance layer 106b is created above the step 106ax of the second variable resistance layer 106b.

The step 106ax is positioned between the first contact plug 104 and the second contact plug 110 (the first contact hole 103 and the second contact hole 109), and is a part which causes a change in elevation in the interface between the first variable resistance layer 106a and the second variable resistance layer 106b. The step 106ax is configured of a side plane that connects a first principal plane and a second principal plane lower than the first principal plane which serve as a boundary planes between the first variable resistance layer 106a and the second variable resistance layer 106b. This side plane is formed to have, for example, a 90 degree angle with respect to one or both of the first principal plane and the second principal plane.

The step 106ax is the part which includes an inflection point at which the flatness changes abruptly in the interface between the first variable resistance layer 106a and the second variable resistance layer 106b, that is, a point at which the continuity of the flatness is interrupted. When the first variable resistance layer 106a and the second variable resistance layer 106b are seen from above or below (when seen from the side in which the upper electrode 107 or the lower electrode 105 is provided), the step 106ax is arranged straightly. It is preferable that the step 106ax be formed at the approximate center in the radial direction of the first contact hole 103 and the second contact hole 109.

The bend 106bx is positioned between the first contact plug 104 and the second contact plug 110 (the first contact hole 103 and the second contact hole 109), and is a part of the second variable resistance layer 106b which bends in the stacking direction of the first variable resistance layer 106a and the second variable resistance layer 106b in the cross-sectional view. The bend 106bx is provided along the step 106ax, and configured of a part above the side plane of the step 106ax.

According to this configuration, the bend 106bx of the second variable resistance layer 106b is formed above the step 106ax of the first variable resistance layer 106a, and thus it is possible to cause the initial break phenomenon even with a low voltage, with the bend 106bx as a starting point of the initial break. Furthermore, since the step shape of the first variable resistance layer 106a is formed in an intentional and controlled manner, the shape of the bend 106bx of the second variable resistance layer 106b is stable, and thus variation in break voltage does not increase. Although only one straight step 106ax is formed here, a plurality of steps may be formed. Forming a plurality is effective in terms of allowing the region serving as the starting point of initial break to be enlarged. With this, lowering the initial break voltage and suppressing variation therein can both be achieved, and miniaturization and increased capacity of memories can be realized.

Furthermore, the lower electrode 105 is also formed in the part of the recess created above the first contact plug 104 inside the first contact hole 103, and is formed so that the surface of the lower electrode 105 is flat. Therefore, the shape and film thickness of the second variable resistance layer 106b at the bend 106bx is dependent only on the shape of the step 106ax of the first variable resistance layer 106a, and is not affected by the shape of the base of a lower layer to the first variable resistance layer 106a. Thus, it is possible to reduce variation in resistance change characteristics between each bit caused by the base.

[Manufacturing Method]

Figure 2:
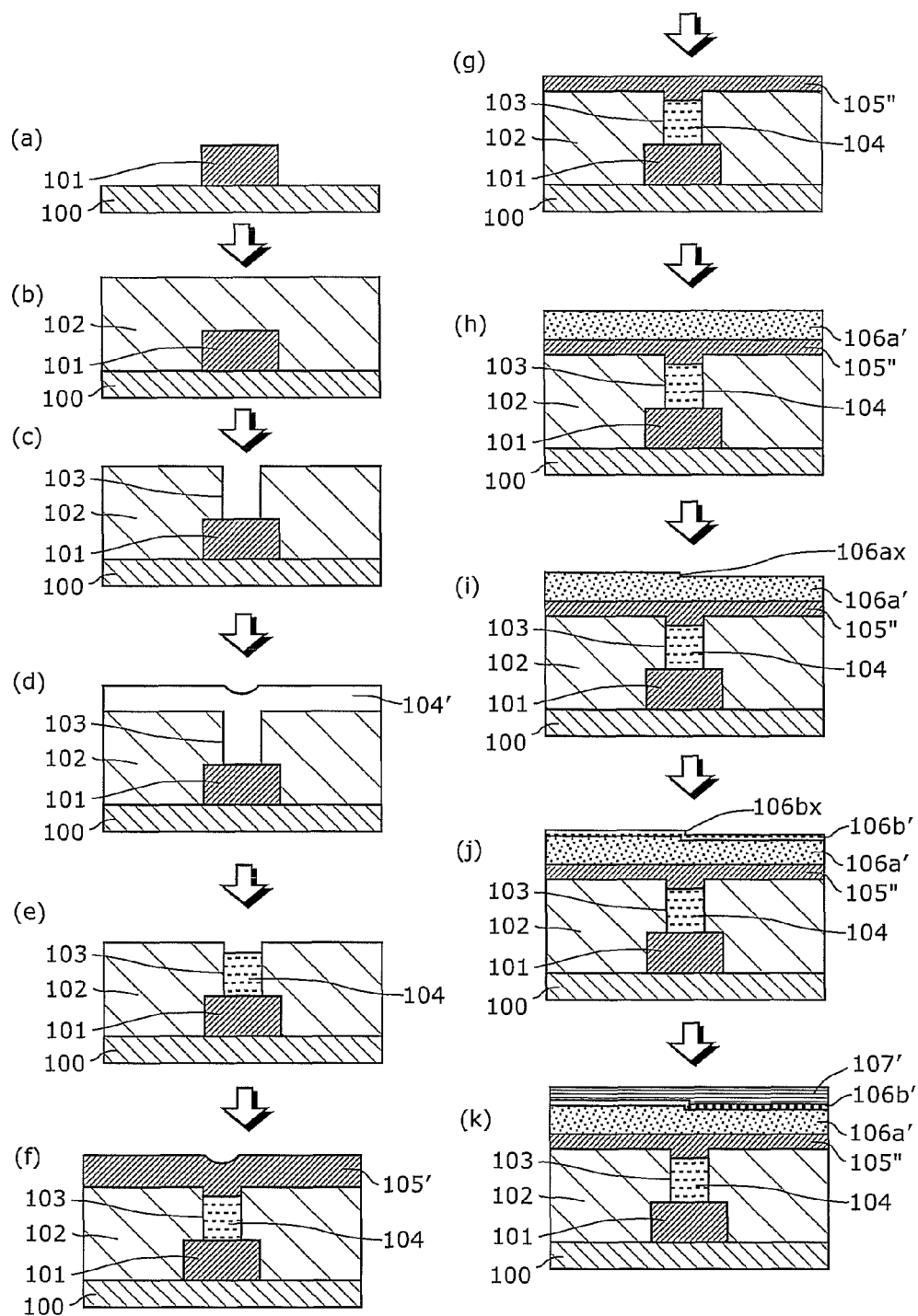
FIG. 2 (*a*) to (*k*) are cross-sectional views showing a method of manufacturing main parts of the nonvolatile memory device in Embodiment 1 of the present invention.
Figure 3:
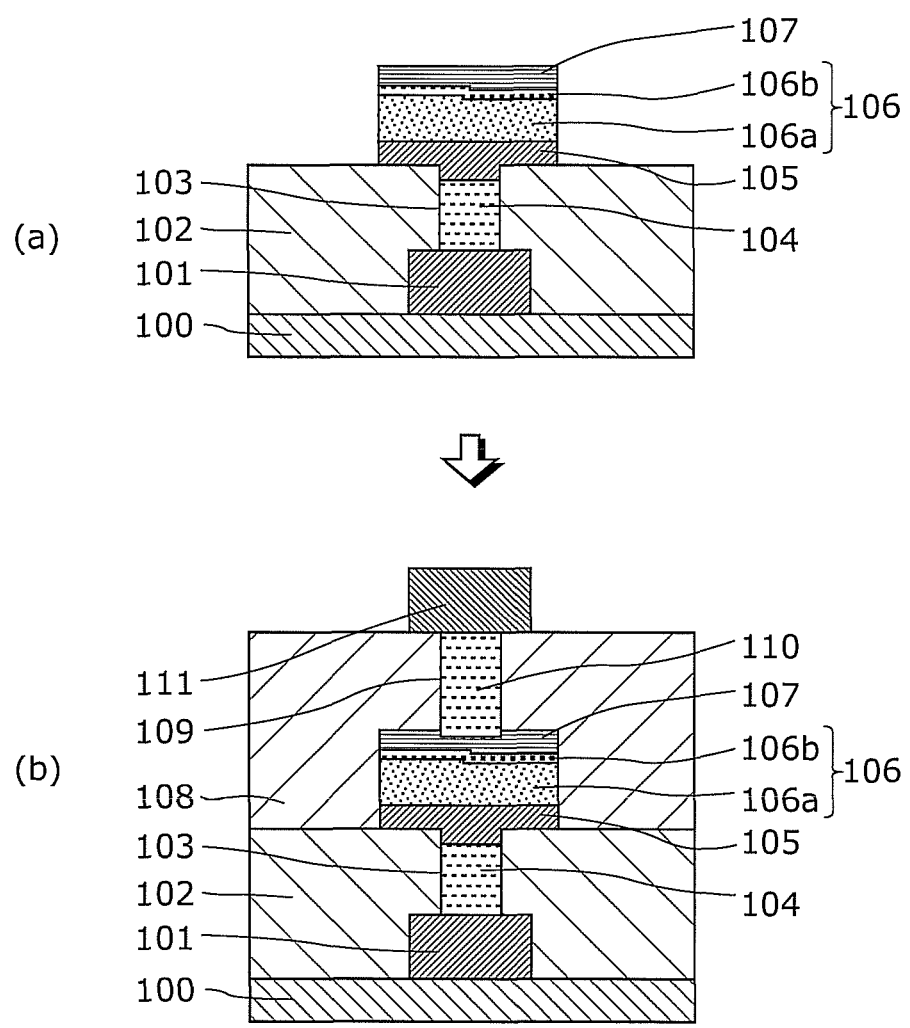
FIGS. 3 (*a*) and (*b*) are cross-sectional views showing a method of manufacturing main parts of the nonvolatile memory device in Embodiment 1 of the present invention.

FIG. 2 (a) to (k) and FIGS. 3 (a) and (b) are cross-sectional views showing a method of manufacturing main parts of the nonvolatile memory device 10 in Embodiment 1 of the present invention. Furthermore, FIG. 4 (a) to (e) are plan views showing the nonvolatile memory device 10 as seen from the top, corresponding to the processes from FIG. 2 (h) to FIG. 3 (a). The method of manufacturing the main parts of the nonvolatile memory device 10 shall be described using these figures.

First, as shown in FIG. 2 (a), in a process of forming the first line 101, the first line 101 is formed by forming a conductive layer (film thickness: 400 to 600 nm) comprising aluminum, on the substrate 100 in which a transistor, a lower layer line, and so on are formed, and performing patterning on the conductive layer.

Next, as shown in FIG. 2 (b), in a process of forming the first interlayer insulating layer 102, the first interlayer insulating layer 102 (film thickness: 500 to 1,000 nm) is formed by forming an insulating layer on the substrate 100 and covering the first line 101, and subsequently planarizing the surface of the insulating layer. A plasma TEOS film can be used for the first interlayer insulating layer 102. Furthermore, in order to reduce the amount of parasitic capacitance between lines, a fluorine-containing oxide (for example, FSG) or a low-k material, and so on can be used for the first interlayer insulating layer 102.

Next, as shown in FIG. 2 (c), in a process of forming the first contact hole 103, patterning is performed on the first interlayer insulating layer 102, using the desired mask, to form the first contact hole 103 (diameter: 50 to 300 nmφ) which penetrates through the first interlayer insulating layer 102 and reaches the first line 101. Here, when the width of the first line 101 is less than the diameter of the first contact hole 103, the area in which the first line 101 and the first contact plug 104 come into contact changes due to the impact of mask misalignment, and thus, for example, cell current fluctuates. From the point of view of preventing the above, the width of the first line 101 is made greater than the diameter of the first contact hole 103.

Next, in a process of forming the first contact plug 104, first, a TiN/Ti layer (film thickness: 5 to 30 nm) which functions as an adhesion layer and a diffusion barrier is formed as a lower layer using the sputtering method, and tungsten (W, film thickness: 200 to 400 nm) which serves as the main component is formed as an upper layer using the CVD method. As a result, as shown in FIG. 2 (d), the first contact hole 103 is filled with a conductive layer 104' having a stacked structure, which is to become the first contact plug 104. However, a depression (depth: 5 to 100 nm) which reflects the shape of the base is created in the top plane of the conductive layer 104' above the first contact hole 103.

Next, as shown in FIG. 2 (e), in the process of forming the first contact plug 104, planarization polishing using the chemical mechanical polishing method (CMP method) is performed on the entire surface of the wafer to remove the unnecessary conductive material 104' on the first interlayer insulating layer 102, and thus form the first contact plug 104 inside the first contact hole 103. At this time, the top plane of the first contact plug 104 and the top plane of the first interlayer insulating layer 102 are not continuous (that is, not on the same plane), and a recess (depth: 5 to 50 nm) is created in the non-continuous part. This is because, as an insulator and a conductor, respectively, the materials comprised in the first interlayer insulating layer 102 and the first contact plug 104 are necessarily different, and thus their polishing rates in the CMP method are different. This is an unavoidable phenomenon which necessarily occurs when using different types of materials.

Next, as shown in FIG. 2 (f), in a process of forming a conductive layer 105' (the lower electrode 105), the conductive layer 105' (film thickness: 50 to 200 nm) comprising a tantalum nitride and which later becomes the lower electrode 105 is formed with the sputtering method, on the first interlayer insulating layer 102 and covering the first contact plug 104. The conductive layer 105' is also formed in the part of the recess created above the first contact plug 104 inside the first contact hole 103. Furthermore, in the same manner as before, a depression which reflects the shape of the base is created in the top plane of the conductive layer 105' above the first contact plug 104.

Next, as shown in FIG. 2 (g), in a process of forming a conductive layer 105" (the lower electrode 105), planarization polishing using the CMP method is performed on the entire surface of the wafer to form the conductive layer 105" (film thickness: 20 to 100 nm) which becomes the lower electrode 105 after patterning. The point of this process is to perform planarization polishing on the conductive layer 105' until the above-described depression in the conductive layer 105' created in FIG. 2 (f) disappears, and to leave behind the entire conductive layer 105". According to such a manufacturing method, the step created above the first contact plug 4 is not transferred onto the surface of the conductive layer 105", and thus the lower electrode 105 is extremely flat throughout the entire surface, and a continuous plane is maintained above the first contact plug 104 and the first interlayer insulating layer 102. This is because, unlike when the contact plug 104 is formed, what is polished is always the same type of material because the polishing of the conductive layer 105" is stopped along the way, and thus, in principle, the difference in polishing rates in the CMP method can be avoided.

Figure 4:
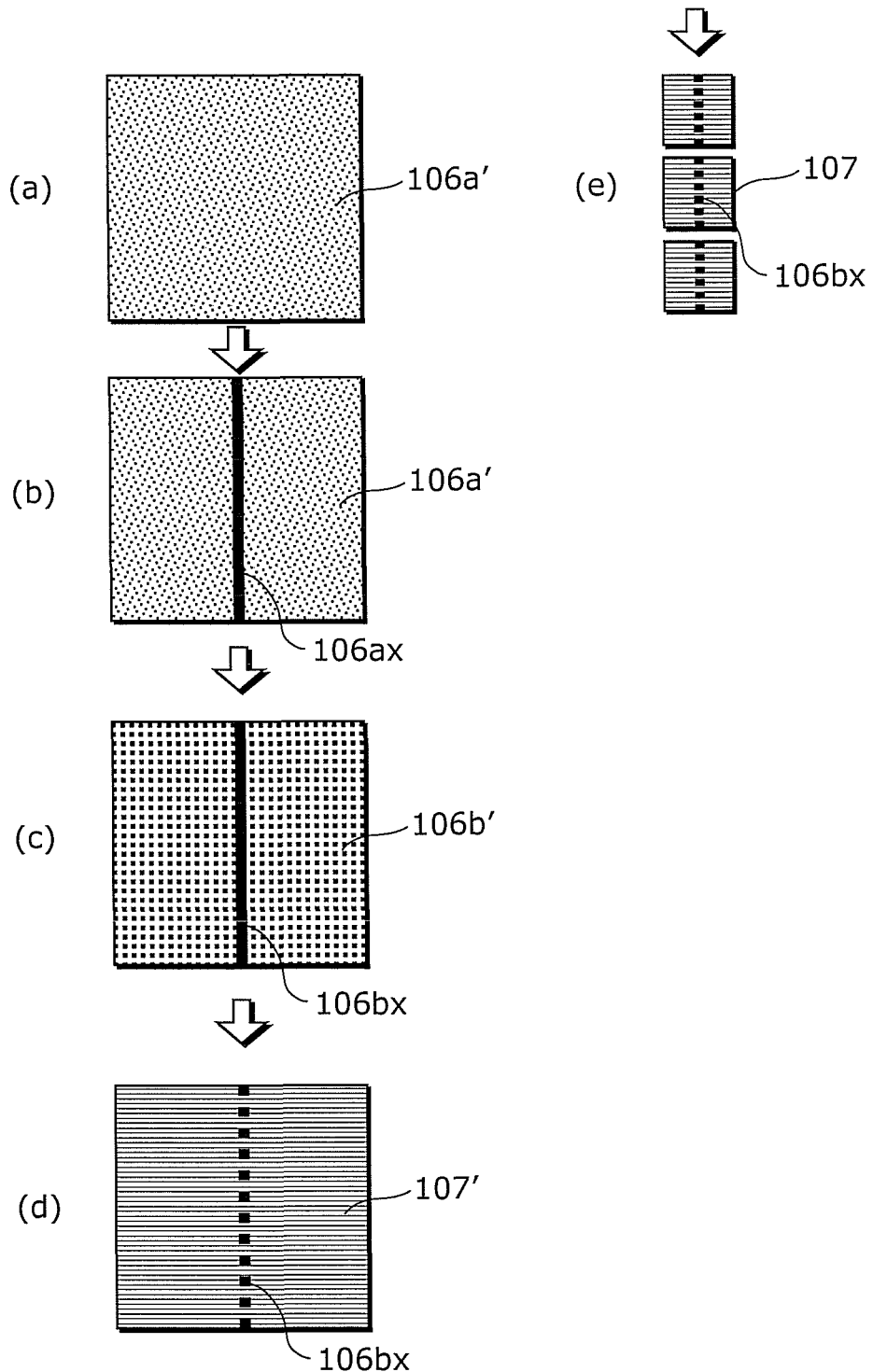
FIG. 4 (*a*) to (*e*) are plan views showing a method of manufacturing main parts of the nonvolatile memory device in Embodiment 1 of the present invention.

Next, as shown in FIG. 2 (h) and FIG. 4 (a), in a process of forming a first variable resistance layer 106a', the first variable resistance layer 106a' comprising a first transitional metal oxide is formed on the conductive layer 105". Here, the first variable resistance layer 106a' is formed using what is called a reactive sputtering method in which sputtering is performed on a tantalum target in an argon (Ar) and oxygen gas atmosphere. The oxygen content of the first variable resistance layer 106a' is 50 to 65 atm %, the resistivity is 2 to 50 mΩcm, and the film thickness is 20 to 100 nm.

Next, as shown in FIG. 2 (i) and FIG. 4 (b), in a process of forming the step 106ax in the first variable resistance layer 106a', the straight step 106ax (height: 1 to 30 nm) is formed, using the desired mask, in the surface of the first variable resistance layer 106a' and extending to an adjacent variable resistance element. On this occasion, it is preferable that an inert gas such as Ar be used as the etching gas in order to prevent fluorine (F), and so on, included in the etching gas from entering the first variable resistance layer 106a' and causing etching damage which causes the film property of the variable resistance layer to deteriorate. Furthermore, it is also preferable to perform we etching using an etching liquid containing hydrofluoric acid (HF) and so on. In this case, the fluorine (F) included in the etching liquid does not enter the variable resistance layer, and thus the variable resistance layer does not deteriorate.

Next, as shown in FIG. 2 (j) and FIG. 4 (c), in a process of forming a second variable resistance layer 106b', the second variable resistance layer 106b' comprising a second transitional metal oxide having a higher oxygen content than the first transitional metal oxide (first variable resistance layer 106a') is formed on the first variable resistance layer 106a' and covering the step in the first variable resistance layer 106a'. In the same manner as in the first variable resistance layer 106a', the second variable resistance layer 106b' is formed with the reactive sputtering method of performing sputtering on a tantalum target in an oxygen gas atmosphere. The oxygen content of the second variable resistance layer 106b' is 67 to 71 atm %, the resistivity is $10^7$ mΩcm or greater, and the film thickness is 2 to 10 nm. The bend 106bx of the second variable resistance layer 106b' is formed above the step 106ax in the surface of the first variable resistance layer 106a'. Here, the film thickness of the bend 106bx (the film thickness on the side wall of the step 106ax) of the second variable resistance layer 106b' can be adjusted to be thin according to the height of the step 106ax base, and a thin-film part can be formed locally in a stable manner. Furthermore, compared to the flat part of the second variable resistance layer 106b', the film property tends to become sparse in the bend 106bx of the second variable resistance layer 106b', and thus a film that allows easy breaking can be realized. Although the variable resistance layer is formed using reactive sputtering in the above-described process, a reactive sputtering method of performing sputtering on a tantalum oxide target in an oxygen gas atmosphere may be used, and the variable resistance layer may be formed by plasma oxidation in an atmosphere that includes oxygen.

Next, as shown in FIG. 2 (k) and FIG. 4 (d), in a process of forming a conductive layer 107' (the upper electrode 107), the conductive layer 107' comprising a noble metal (platinum, iridium, palladium, and so on) which becomes the upper electrode 107 after patterning is formed on the second variable resistance layer 106b'.

Next, as shown in FIG. 3 (a) and FIG. 4 (e), in a process of forming the variable resistance element, patterning using the desired mask is performed on the conductive layer 105", the first variable resistance layer 106a', the second variable resistance layer 106b', and the conductive layer 107' shown in FIG. 2 (k) to form the variable resistance element in which the variable resistance layer 106 configured of the stacked layers of the first variable resistance layer 106a and the second variable resistance layer 106b is held between the lower electrode 105 and the upper electrode 107. Since etching is difficult to perform on a noble metal and the like which is typified as a material having high standard electrode potential, when a noble metal is used for the upper electrode 107, the variable resistance element can also be formed with such upper electrode 107 as a hard mask. Although, in the present process, patterning is performed collectively on the respective layers of the variable resistance element using the same mask, patterning may be performed on a per layer basis.

Lastly, as shown in FIG. 3 (b), the second interlayer insulating layer 108 (film thickness: 500 to 1000 nm) is formed covering the variable resistance element, and the second contact hole 109 and the second contact plug 110 are formed according to the same manufacturing method as in FIGS. 2 (b) and (c). Subsequently, the second line 111 is formed covering the second contact plug 110, and the nonvolatile memory device 10 is completed.

By adopting the above-described manufacturing method, it is possible to reflect the shape of the step of the surface of the first variable resistance layer 106a and thereby stably form the bend 106bx in the second variable resistance layer 106b on the step 106ax, and thus it is possible to cause the break phenomenon even with a low voltage, with the bend 106bx as a starting point of the initial break. Furthermore, since the step shape of the first variable resistance layer 106a is formed in an intentional and controlled manner, the shape of the bend 106bx of the second variable resistance layer 106b is stable, and thus variation in initial break voltage does not increase. Therefore, lowering the break voltage and suppressing variation therein can both be achieved, and miniaturization and increased capacity of memories can be realized.

Embodiment 2

Device Configuration

FIG. 5 (*a*) is a cross-sectional view of a nonvolatile memory device 20 in Embodiment 2 of the present invention, and FIG. 5 (*b*) is a plan view of the first variable resistance layer 106*a* included therein. In FIG. 5, the same numerical references are used for elements that are the same as in FIG. 1, and description thereof shall not be repeated.

As shown in FIGS. 5 (*a*) and (*b*), the difference between the nonvolatile memory device 20 in Embodiment 2 and the nonvolatile memory device 10 in Embodiment 1 is in the shape of the step that is formed in the first variable resistance layer 106*a*. In the nonvolatile memory device 10, the step 106*ax* formed in the surface of the first variable resistance layer 106*a* is straight-shaped, whereas, in the nonvolatile memory device 20, a ring-shaped step 106*ay* (height: 1 to 30 nm, length: 250 nm×4=1000 nm), that is, a depressed part is formed. Accordingly, a bend 106*by* of the second variable resistance layer 106*b* is also ring-shaped. In the present embodiment, a longer step pattern can be formed in one variable resistance element compared to the straight step pattern, and thus the region of the bend 106*by* of the second variable resistance layer 106*b* can be enlarged, and further lowering of the break voltage becomes possible because the region serving as the starting point of the break phenomenon is augmented.

The step 106*ay* is positioned between the first contact plug 104 and the second contact plug 110 (the first contact hole 103 and the second contact hole 109), and is a part which causes a change in elevation in the interface between the first variable resistance layer 106*a* and the second variable resistance layer 106*b*. The step 106*ay* is configured of a side plane that connects a first principal plane and a second principal plane lower than the first principal plane which serve as boundary planes between the first variable resistance layer 106*a* and the second variable resistance layer 106*b*. This side plane is formed to have, for example, a 90 degree angle with respect to one or both of the first principal plane and the second principal plane.

The step 106*ay* is the part which includes an inflection point at which the flatness changes abruptly in the interface between the first variable resistance layer 106*a* and the second variable resistance layer 106*b*, that is, a point at which the continuity of the flatness is interrupted. When the first variable resistance layer 106*a* and the second variable resistance layer 106*b* are seen from above or below (when seen from the side in which the upper electrode 107 or the lower electrode 105 is provided), the step 106*ay* is arranged in a ring-shape. It is preferable that the center of the ring-shaped step 106*ay* be formed at the approximate center in the radial direction of the first contact hole 103 and the second contact hole 109.

The bend 106*by* is positioned between the first contact plug 104 and the second contact plug 110 (the first contact hole 103 and the second contact hole 109), and is configured of a part of the second variable resistance layer 106*b* which bends in the stacking direction of the first variable resistance layer 106*a* and the second variable resistance layer 106*b* in the cross-sectional view. The bend 106*by* is provided along the step 106*ay*, and is and is configured of a part above the side plane of the step 106*ay*.

According to this configuration, the bend 106*by* of the second variable resistance layer 106*b* is formed above the step 106*ay* of the first variable resistance layer 106*a*, and thus it is possible to cause the break phenomenon even with a low voltage, with the bend 106*by* as a starting point of the initial break. Furthermore, since the shape of the step of the first variable resistance layer 106*a* is formed in an intentional and controlled manner, the shape of the bend 106*by* of the second variable resistance layer 106*b* is stable, and thus variation in break voltage does not increase. Although only one ring-shaped step 106*ay* is formed here, a plurality may be formed. Forming a plurality is effective in terms of allowing the region serving as the starting point of the break phenomenon to be enlarged. With this, lowering the break voltage and suppressing variation therein can both be achieved, and miniaturization and increased capacity of memories can be realized.

[Manufacturing Method]

Figure 6:
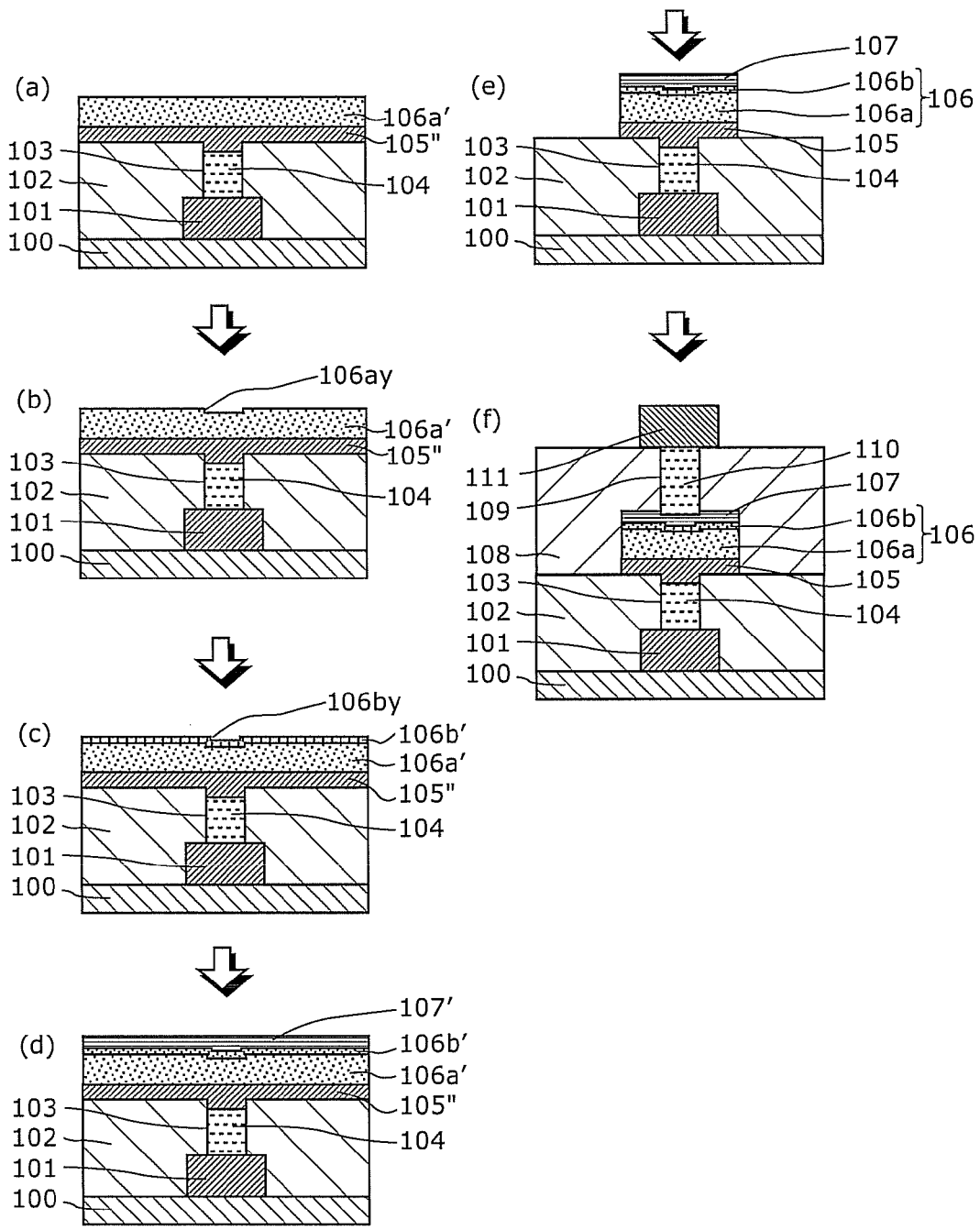
FIG. 6 (*a*) to (*f*) are cross-sectional views showing a method of manufacturing main parts of the nonvolatile memory device in Embodiment 2 of the present invention.

FIG. 6 (*a*) to (*f*) are cross-sectional views showing a method of manufacturing main parts of the nonvolatile memory device 20 in Embodiment 2 of the present invention. Furthermore, FIG. 7 (*a*) to (e) are plan views of the nonvolatile memory device 20 as seen from the top, corresponding to the processes shown in FIG. 6 (*a*) to (*e*), respectively. The method of manufacturing the main parts of the nonvolatile memory device 20 shall be described using these figures. Furthermore, processes prior to FIG. 6 (*a*) are the same as in FIG. 2 (*a*) to (*g*), and thus description thereof shall not be repeated.

Figure 7:
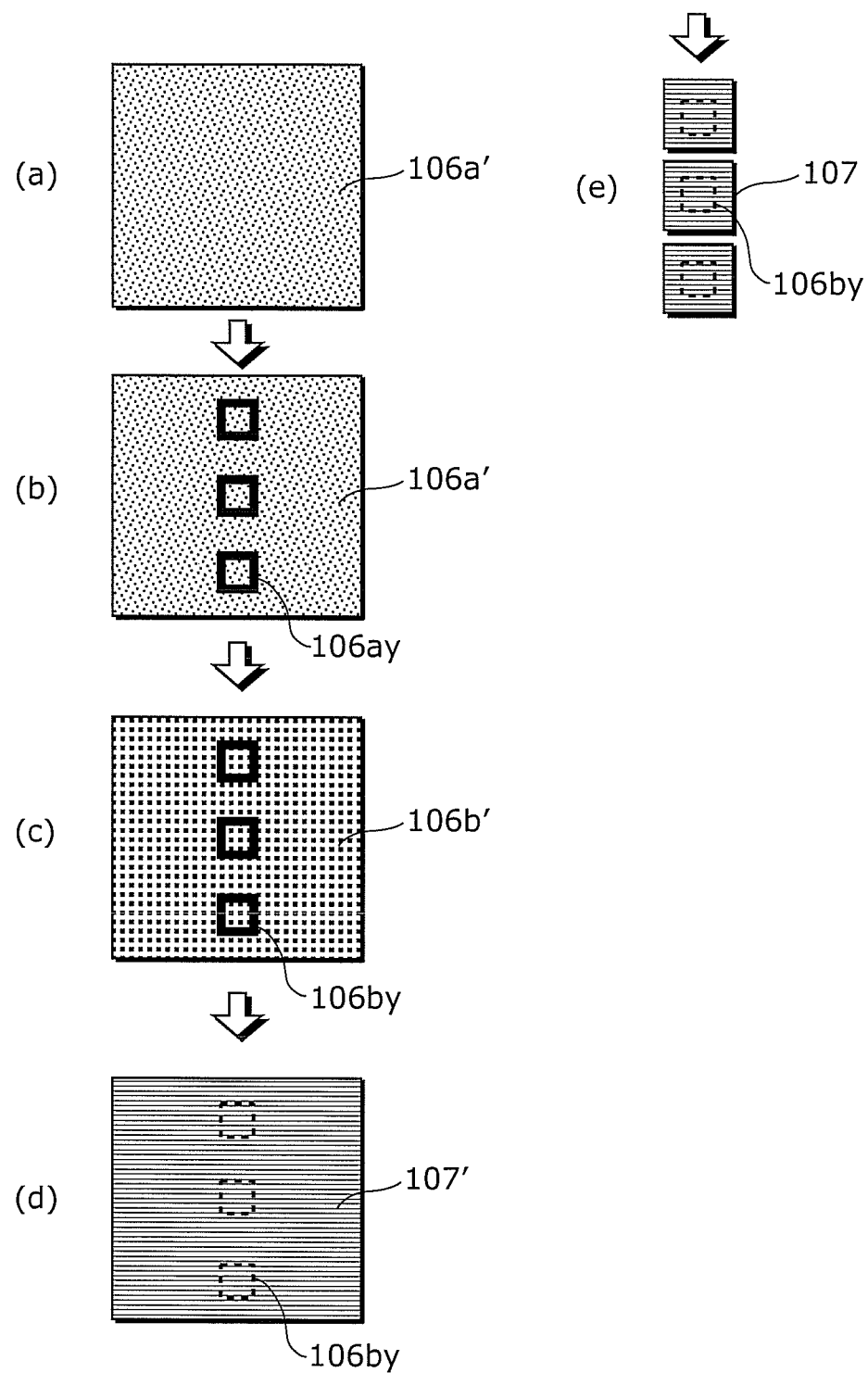
FIG. 7 (*a*) to (*e*) are plan views showing a method of manufacturing main parts of the nonvolatile memory device in Embodiment 2 of the present invention.

As shown in FIG. 6 (*a*) and FIG. 7 (*a*), in the process of forming the first variable resistance layer 106*a'*, the first variable resistance layer 106*a'* comprising a transitional metal oxide is formed on the conductive layer 105''. Here, the first variable resistance layer 106*a'* is formed using what is called a reactive sputtering method in which sputtering is performed on a tantalum target in an argon (Ar) and oxygen gas atmosphere. The oxygen content of the first variable resistance layer 106*a'* is 50 to 65 atm %, the resistivity is 2 to 50 mΩcm, and the film thickness is 20 to 100 nm.

Next, as shown in FIG. 6 (*b*) and FIG. 7 (*b*), in a process of forming the step 106*ay* in the first variable resistance layer 106*a'*, the ring-shaped step 106*ay* (height: 1 to 30 nm) is formed, using the desired mask, in the surface of the first variable resistance layer 106*a'* such that one ring-shaped step 106*ay* is always included during the subsequent forming of the variable resistance element. On this occasion, it is preferable that an inert gas such as Ar be used as the etching gas in order to prevent fluorine (F), and so on, included in the etching gas from entering the first variable resistance layer 106*a'* and causing etching damage which causes the film property of the variable resistance layer to deteriorate. Furthermore, it is also preferable to perform we etching using an etching liquid containing hydrofluoric acid (HF) and so on. In this case, the fluorine (F) included in the etching liquid does not enter the variable resistance layer, and thus the variable resistance layer does not deteriorate.

Figure 8A:
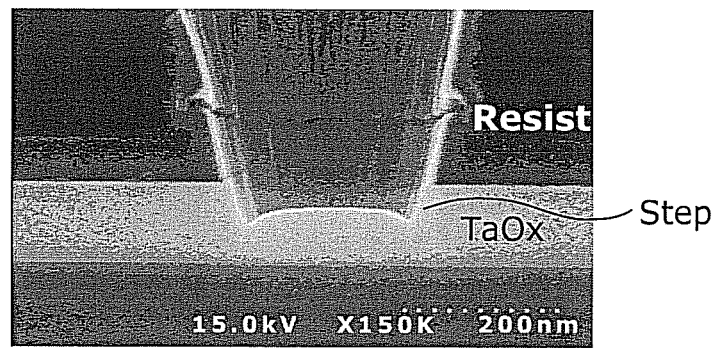
FIG. 8A is a SEM image cross-sectional view of a main part in a process in which a step is formed in the first variable resistance layer, in the method of manufacturing the nonvolatile memory device in Embodiment 2 of the present invention.

FIG. 8A shows a cross-sectional view according to a SEM image taken immediately after a ring-shaped step 106*ay* is formed in the first variable resistance layer 106*a'* comprising a tantalum oxide (TaO$_x$). It can be seen that a ring-shaped step with a height of 30 nm and a ring diameter of 250 nm is formed using a photo resist mask.

As shown in FIG. 6 (*c*) and FIG. 7 (*c*), in the process of forming the second variable resistance layer 106*b'*, the second variable resistance layer 106*b'* having a higher oxygen content than the first variable resistance layer 106*a'* is formed on the first variable resistance layer 106*a'*. In the same manner as in the first variable resistance layer 106*a'*, the second variable resistance layer 106*b'* is formed with the reactive sputtering method of performing sputtering on a tantalum target in an oxygen gas atmosphere. The oxygen content of the second variable resistance layer 106*b'* is 67 to 71 atm %, the resistivity is $10^7$ mΩcm or greater, and the film thickness is 2 to 10 nm. The bend 106*by* of the second variable resistance layer 106*b*' is formed above the step 106*ay* in the surface of the first variable resistance layer 106*a*'. Here, the film thickness of the bend 106*bx* (the thickness on the side wall of the depressed part of the first variable resistance layer 106*a*') of the second variable resistance layer 106*b*' can be adjusted to be thin according to the height of the step 106*ay* base (the depth of the depressed part), and a thin-film part can be formed locally in a stable manner. Furthermore, compared to the flat part of the second variable resistance layer 106*b*', the film property tends to become sparse in the bend 106*by* of the second variable resistance layer 106*b*', and thus a film that allows easy breaking can be realized. Although the variable resistance layer is formed using reactive sputtering, a reactive sputtering method of performing sputtering on a tantalum oxide target in an oxygen gas atmosphere may be used, and the variable resistance layer may be formed by plasma oxidation in an atmosphere that includes oxygen.

Next, as shown in FIG. 6 (*d*) and FIG. 7 (*d*), in the process of forming the conductive layer 107' (the upper electrode 107), the conductive layer 107' comprising a noble metal (platinum (Pt), iridium (Ir), palladium (Pd), and so on) which becomes the upper electrode 107 after patterning is formed on the second variable resistance layer 106*b*'.

Next, as shown in FIG. 6 (*e*) and FIG. 7 (*e*), in the process of forming the variable resistance element, patterning using the desired mask is performed on the conductive layer 105", the first variable resistance layer 106*a*', the second variable resistance layer 106*b*', and the conductive layer 107' to form the variable resistance element in which the variable resistance layer 106 configured of the stacked layers of the first variable resistance layer 106*a* and the second variable resistance layer 106*b* is held between the lower electrode 105 and the upper electrode 107. As in Embodiment 1, in the case of the straight step 106*ax*, the etching volume with the step 106*ax* as the axis is different between the left and right and there is concern over etching left-over and base scraping due to over-etching. However, since the ring-shaped step 106*ay* is contained inside the variable resistance element, the volume of the first variable resistance layer 106*a*' to be etched does not change. In other words, etching left-over and base scraping due to over-etching do not occur easily, and thus manufacturing yield can be improved.

Lastly, as shown in FIG. 6 (*f*), the second interlayer insulating layer 108 (film thickness: 500 to 1000 nm) is formed covering the variable resistance element, and the second contact hole 109 and the second contact plug 110 are formed. Subsequently, the second line 111 is formed covering the second contact plug 110, and the nonvolatile memory device 20 is completed.

By adopting the above-described manufacturing method, it is possible to reflect the shape of the step of the surface of the first variable resistance layer 106*a* and thereby stably form the bend 106*by* in the second variable resistance layer 106*b* on the step 106*ay*, and thus it is possible to cause the break phenomenon even with a low voltage, with the bend 106*bx* as a starting point of the initial break. Furthermore, since the step shape of the first variable resistance layer 106*a* is formed in an intentional and controlled manner, the shape of the bend 106*by* of the second variable resistance layer 106*b* is stable, and thus variation in initial break voltage does not increase. Therefore, lowering the break voltage and suppressing variation therein can both be achieved, and miniaturization and increased capacity of memories can be realized.

Figure 8B:
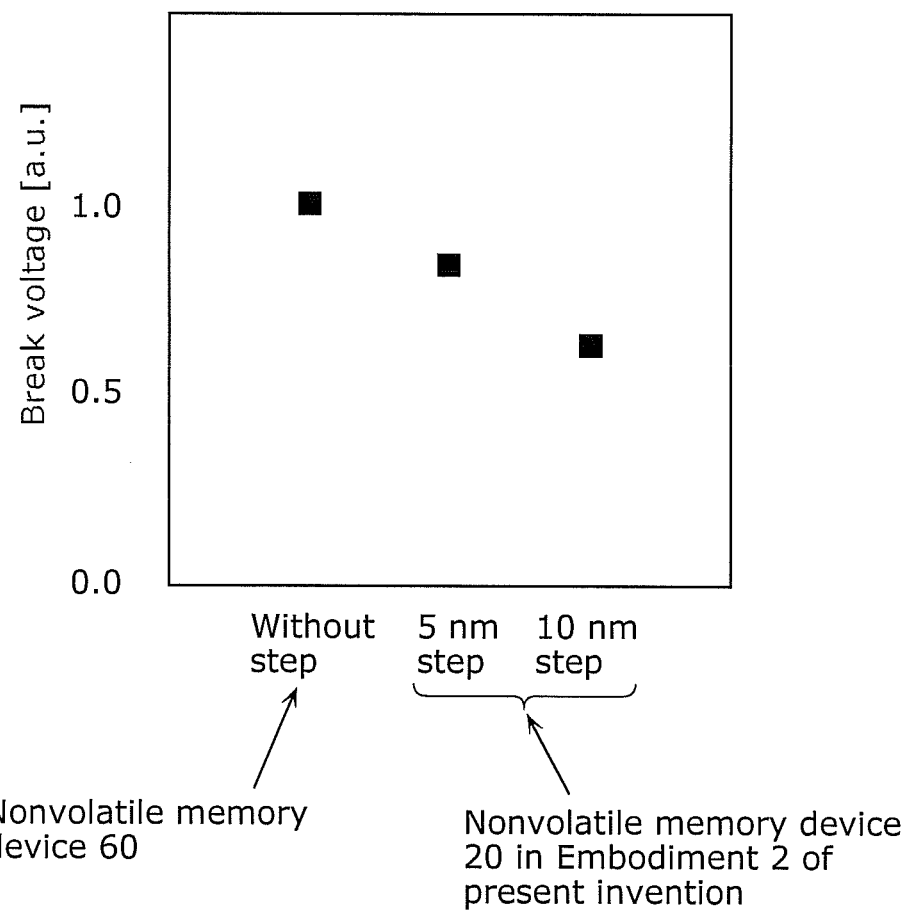
FIG. 8B is a graph showing break voltage characteristics of the nonvolatile memory device in Embodiment 2 of the present invention.

FIG. 8B is a graph showing the initial break voltage of the above-described nonvolatile memory device 20. The graph also evaluates the initial break voltage required when the variable resistance element and a load resistance of 5 kΩ are connected in series as in FIG. 19. In FIG. 8B, the break voltage is shown by standardizing, as 1.0, the break voltage of the nonvolatile memory device 60 in which a step is not formed in the first variable resistance layer 106*a*. In the case of the nonvolatile memory device 20 in Embodiment 2 of the present invention (the case where a step is formed in the first variable resistance layer 106*a*), it can be seen that lowering of the break voltage is realized. Furthermore, because it can be inferred that the percentage for the lowering of the break voltage also tends to increase when the step amount (the amount of the difference in elevation between the surfaces at the step 106*ay*) is increased, it is also recognized that the break voltage can be controlled through the step amount.

Embodiment 3

Device Configuration

FIG. 9 (*a*) is a cross-sectional view of a nonvolatile memory device 30 in Embodiment 3 of the present invention, and FIG. 9 (*b*) is a plan view of the surface of the bottom electrode 105 included therein. In FIG. 9, the same numerical references are used for elements that are the same as in FIG. 1, and description thereof shall not be repeated.

As shown in FIGS. 9 (*a*) and (*b*), the difference between the nonvolatile memory device 30 in Embodiment 3 and the nonvolatile memory device 10 in Embodiment 1 is in the structure in which the first variable resistance layer 106*a* and the second variable resistance layer 106*b* are in a vertically-reversed placement. In the nonvolatile memory device 10, the bend 106*bx* of the second variable resistance layer 106*b* is formed above the step 106*ax* formed in the surface of the first variable resistance layer 106*a*. In contrast, in the nonvolatile memory device 30, the second variable resistance layer 106*b* is formed on a straight step 105*s* formed in the surface (the interface with the second variable resistance layer 106*b*) of the bottom electrode 105, and the first variable resistance layer 106*a* is formed on the second variable resistance layer 106*b*. The second variable resistance layer 106*b* is formed covering the step 105*s*, and a bend 106*bs* is formed in the second variable resistance layer 106*b* above the step 105*s*. The upper electrode 107 is formed on the first variable resistance layer 106*a*.

The step 105*s* is positioned between the first contact plug 104 and the second contact plug 110 (the first contact hole 103 and the second contact hole 109), and is a part which causes a change in elevation in the interface between the lower electrode 105 and the second variable resistance layer 106*b*. The step 105*s* is configured of the side plane connecting a first principal plane and a second principal plane lower than the first principal plane which serve as boundary planes between the lower electrode 105 and the second variable resistance layer 106*b*. This side plane is formed to have, for example, a 90 degree angle with respect to one or both of the first principal plane and the second principal plane.

The step 105*s* is the part which includes an inflection point at which the flatness changes abruptly in the interface between the first variable resistance layer 106*a* and the second variable resistance layer 106*b*, that is, a point at which the continuity of the flatness is interrupted. When the bottom electrode 105 and the second variable resistance layer 106*b* are seen from above or below (when seen from the side in which the upper electrode 107 or the lower electrode 105 is provided), the step 105*s* is arranged straightly. It is preferable that the step 105s be formed at the approximate center of the width direction of the first contact hole 103 and the second contact hole 109.

The bend 106bs is positioned between the first contact plug 104 and the second contact plug 110 (the first contact hole 103 and the second contact hole 109), and is a part of the second variable resistance layer 106b which bends in the stacking direction of the first variable resistance layer 106a and the second variable resistance layer 106b in the cross-sectional view. The bend 106bx is provided along the step 105s, and configured of a part above the side plane of the step 105s.

According to this configuration, the bend 106bs of the second variable resistance layer 106b is formed above the step 105s of the lower electrode 105, and thus it is possible to cause the break phenomenon even with a low voltage, with the bend 106bs as a starting point of the initial break. Furthermore, since the step shape of the lower electrode 105 is formed in an intentional and controlled manner, the shape of the bend 106bs of the second variable resistance layer 106b is stable, and thus variation in initial break voltage does not increase. Although only one straight step 105s is formed here, a plurality may be formed. Forming a plurality is effective in terms of allowing the region serving as the starting point of the break phenomenon to be enlarged. With this, lowering the break voltage and suppressing variation therein can both be achieved, and miniaturization and increased capacity of memories can be realized.

[Manufacturing Method]

Figure 10:
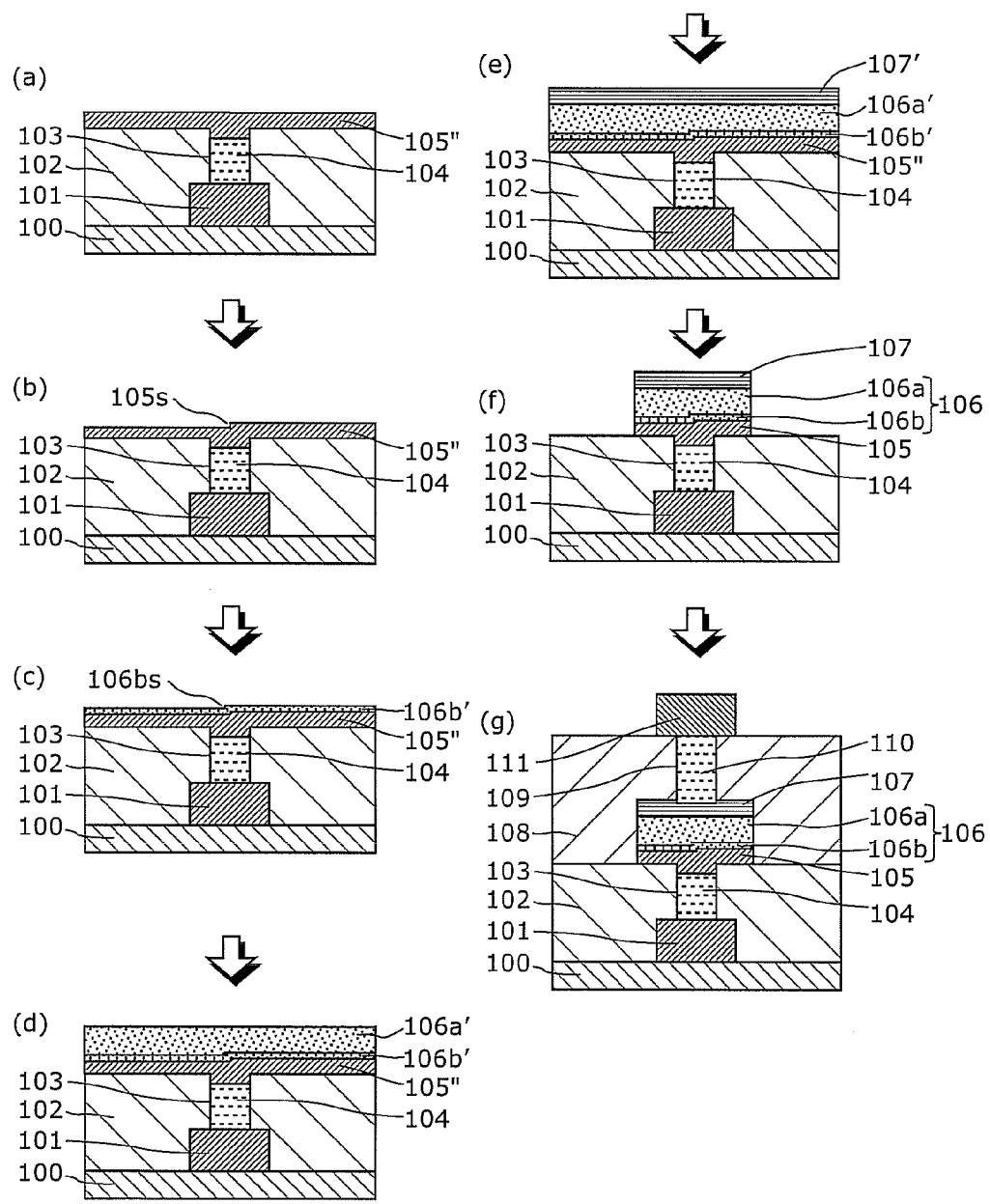
FIG. 10 (*a*) to (*g*) are cross-sectional views showing a method of manufacturing main parts of the nonvolatile memory device in Embodiment 3 of the present invention.

FIG. 10 (a) to (g) are cross-sectional views showing a method of manufacturing main parts of the nonvolatile memory device 30 in Embodiment 3 of the present invention. Furthermore, FIG. 11 (a) to (f) are plan views of the nonvolatile memory device 30 as seen from the top, corresponding to the processes shown in FIG. 10 (a) to (f), respectively. The method of manufacturing the main parts of the nonvolatile memory device 30 shall be described using these figures. Furthermore, processes prior to FIG. 10 (a) are the same as shown in FIG. 2 (a) to (f), and thus description thereof shall not be repeated.

Figure 11:
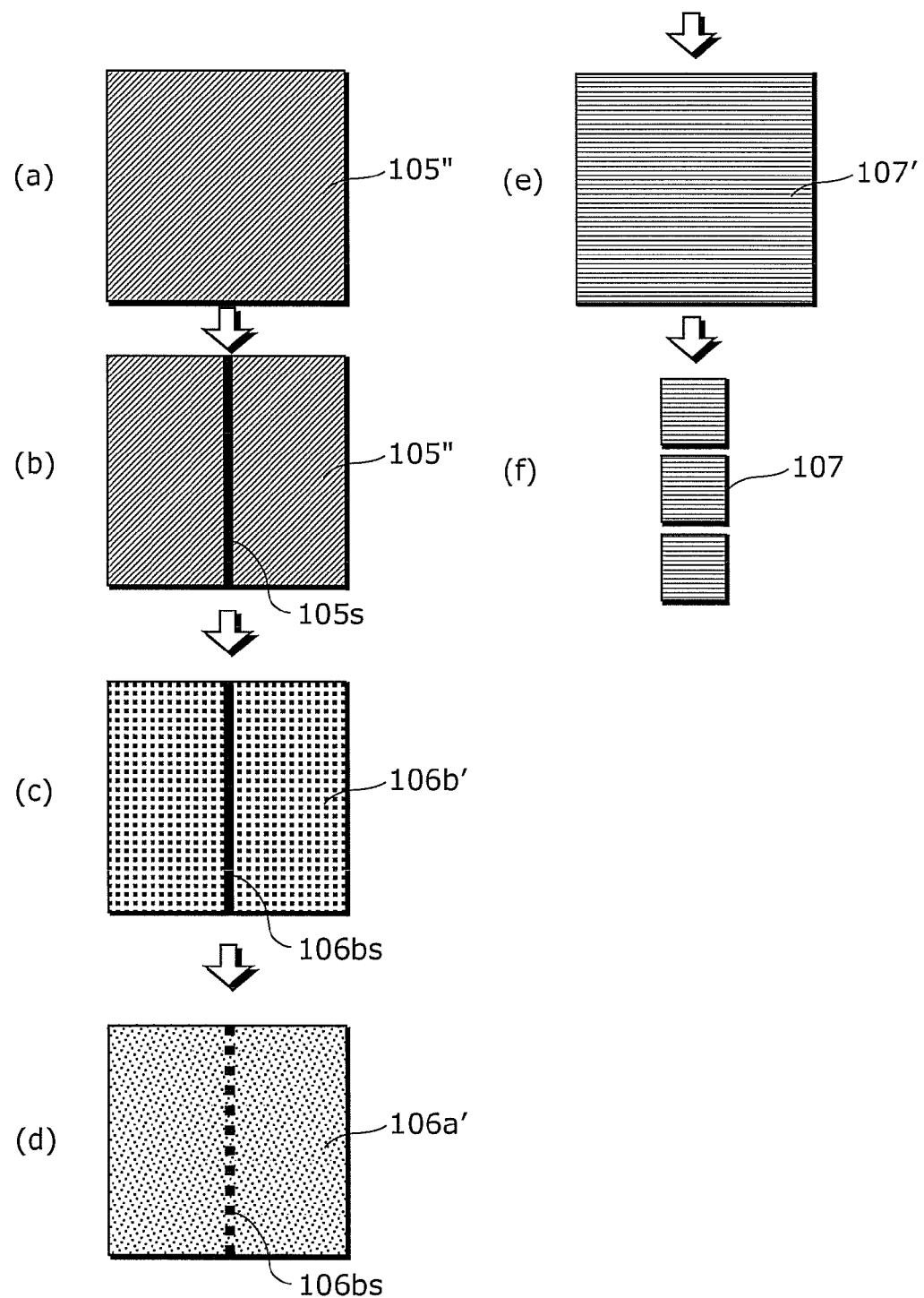
FIG. 11 (*a*) to (*f*) are plan views showing a method of manufacturing main parts of the nonvolatile memory device in Embodiment 3 of the present invention.

As shown in FIG. 10 (a) and FIG. 11 (a), in the process of forming the conductive layer 105" (the lower electrode 105), planarization polishing using the chemical mechanical polishing method (CMP method) is performed on the entire surface of the wafer to form the conductive layer 105" (film thickness: 20 to 100 nm) which becomes the lower electrode 105 after patterning.

Next, as shown in FIG. 10 (b) and FIG. 11 (b), in the process of forming the step 105s in the conductive layer 105" (the lower electrode 105), the straight step 105s (height: 1 to 30 nm) is formed, using the desired mask, in the surface of the conductive layer 105" and extending to an adjacent variable resistance element. In order not to cause etching damage to the lower electrode 105, it is preferable that an inert gas such as Ar and the like be used as the etching gas.

As shown in FIG. 10 (c) and FIG. 11 (c), in the process of forming the second variable resistance layer 106b', the second variable resistance layer 106b' comprising a second transitional metal oxide having a higher oxygen content than a first transitional metal oxide (first variable resistance layer 106a') is formed on the conductive layer 105" and covering the step of the conductive layer 105". Here, the second variable resistance layer 106b' is formed using what is called a reactive sputtering method in which sputtering is performed on a tantalum target in an oxygen gas atmosphere. The oxygen content of the second variable resistance layer 106b' is 67 to 71 atm %, the resistivity is $10^7$ mΩcm or greater, and the film thickness is 2 to 10 nm. The bend 106bs of the second variable resistance layer 106b' is formed above the step 105s on the surface of the conductive layer 105". Here, the film thickness of the bend 106bs (the film thickness on the side wall of the step 105s) of the second variable resistance layer 106b' can be adjusted to be thin according to the height of the step 105s base, and a thin-film part can be formed locally in a stable manner. Furthermore, compared to the flat part of the second variable resistance layer 106b', the film property tends to become sparse in the bend 106bs of the second variable resistance layer 106b', and thus a film that allows easy breaking can be realized. Although the variable resistance layer is formed using reactive sputtering in the above-described process, the variable resistance layer may be formed by using a reactive sputtering method of performing sputtering on a tantalum oxide target in an oxygen gas atmosphere.

Next, as shown in FIG. 10 (d) and FIG. 11 (d), in the process of forming the first variable resistance layer 106a', the first variable resistance layer 106a' comprising the first transitional metal oxide is formed on the second variable resistance layer 106b'. As in the previous description, the first variable resistance layer 106a' is formed using what is called a reactive sputtering method in which sputtering is performed on a tantalum target in an argon (Ar) and oxygen gas atmosphere. The oxygen content of the first variable resistance layer 106a' is 50 to 65 atm %, the resistivity is 2 to 50 mΩcm, and the film thickness is 20 to 100 nm.

Next, as shown in FIG. 10 (e) and FIG. 11 (e), in the process of forming a conductive layer 107' (the upper electrode 107), the conductive layer 107' comprising a noble metal (platinum, iridium, palladium, and so on) which becomes the upper electrode 107 after patterning is formed on the first variable resistance layer 106a'.

Next, as shown in FIG. 10 (f) and FIG. 11 (f), in the process of forming the variable resistance element, patterning using the desired mask is performed on the conductive layer 105", the second variable resistance layer 106b', the first variable resistance layer 106a', and the conductive layer 107' to form the variable resistance element in which the variable resistance layer 106 configured of the stacked layers of the second variable resistance layer 106b and the first variable resistance layer 106a is held between the lower electrode 105 and the upper electrode 107.

Lastly, as shown in FIG. 10 (g), the second interlayer insulating layer 108 (film thickness: 500 to 1000 nm) is formed covering the variable resistance element, and the second contact hole 109 and the second contact plug 110 are formed. Subsequently, the second line 111 is formed covering the second contact plug 110, and the nonvolatile memory device 30 is completed.

By adopting the above-described manufacturing method, it is possible to reflect the shape of the step of the lower electrode 105 and thereby stably form the bend 106bs in the second variable resistance layer 106b on the step 105s, and thus it is possible to cause the break phenomenon even with a low voltage, with the bend 106bs as a starting point of the initial break. Furthermore, since the step shape of the lower electrode 105 is formed in an intentional and controlled manner, the shape of the bend 106bs of the second variable resistance layer 106b is stable, and thus variation in break voltage does not increase. Therefore, lowering the break voltage and suppressing variation therein can both be achieved, and miniaturization and increased capacity of memories can be realized.

Embodiment 4

Device Configuration

FIG. 12 (a) is a cross-sectional view of a nonvolatile memory device 40 in Embodiment 4 of the present invention, and FIG. 12 (b) is a plan view of the surface of the lower electrode 105 included therein. In FIG. 12, the same numerical references are used for elements that are the same as in FIG. 9, and description thereof shall not be repeated.

As shown in FIGS. 12 (a) and (b), the difference between the nonvolatile memory device 40 in Embodiment 4 and the nonvolatile memory device 30 in Embodiment 3 is in the shape of the step that is formed in the lower electrode 105. In the nonvolatile memory device 30, the straight step 105s is formed on the surface of the lower electrode 105, whereas, in the nonvolatile memory device 40, a ring-shaped step 105t (height: 1 to 30 nm, length: 250 nm×4=1000 nm), that is, a depressed part is formed. Accordingly, a bend 106bt of the second variable resistance layer 106b is also ring-shaped. In the present embodiment, a longer step pattern can be formed in one variable resistance element compared to the straight step pattern, and thus the region of the bend 106bt of the second variable resistance layer 106b can be enlarged, and further lowering of the break voltage becomes possible because the region serving as the starting point of the break phenomenon is augmented.

The step 105t is positioned between the first contact plug 104 and the second contact plug 110 (the first contact hole 103 and the second contact hole 109), and is a part which causes a change in elevation in the interface between the lower electrode 105 and the second variable resistance layer 106b. The step 105t is configured of the side plane connecting a first principal plane and a second principal plane lower than the first principal plane which serve as boundary planes between the lower electrode 105 and the second variable resistance layer 106b. This side plane is formed to have a 90 degree angle with respect to one or both of the first principal plane and the second principal plane.

The step 105t is the part which includes an inflection point at which the flatness changes abruptly in the interface between the first variable resistance layer 106a and the second variable resistance layer 106b, that is, a point at which the continuity of the flatness is interrupted. When the lower electrode 105 and the second variable resistance layer 106b are seen from above or below (when seen from the side in which the upper electrode 107 or the lower electrode 105 is provided), the step 105t is arranged in a ring-shape. It is preferable that the center of the ring-shaped step 105t be formed at the approximate center in the radial direction of the first contact hole 103 and the second contact hole 109.

The bend 106bt is positioned between the first contact plug 104 and the second contact plug 110 (the first contact hole 103 and the second contact hole 109), and is a part of the second variable resistance layer 106b which bends in the stacking direction of the first variable resistance layer 106a and the second variable resistance layer 106b in the cross-sectional view. The bend 106bt is provided along the step 105t, and configured of a part above the side plane of the step 105t.

According to this configuration, it is possible to reflect the shape of the step of the lower electrode 105 and thereby stably form the bend 106bt in the second variable resistance layer 106b on the step 105t, and thus it is possible to cause the break phenomenon even with a low voltage, with the bend 106bt as a starting point of the initial break. Furthermore, since the step shape of the lower electrode 105 is formed in an intentional and controlled manner, the shape of the bend 106bt of the second variable resistance layer 106b is stable, and thus variation in break voltage does not increase. Although only one ring-shaped step 105t is formed here, a plurality may be formed. Forming a plurality is effective in terms of allowing the region serving as the starting point of the break phenomenon to be enlarged. With this, lowering the break voltage and suppressing variation therein can both be achieved, and miniaturization and increased capacity of memories can be realized.

[Manufacturing Method]

Figure 13:
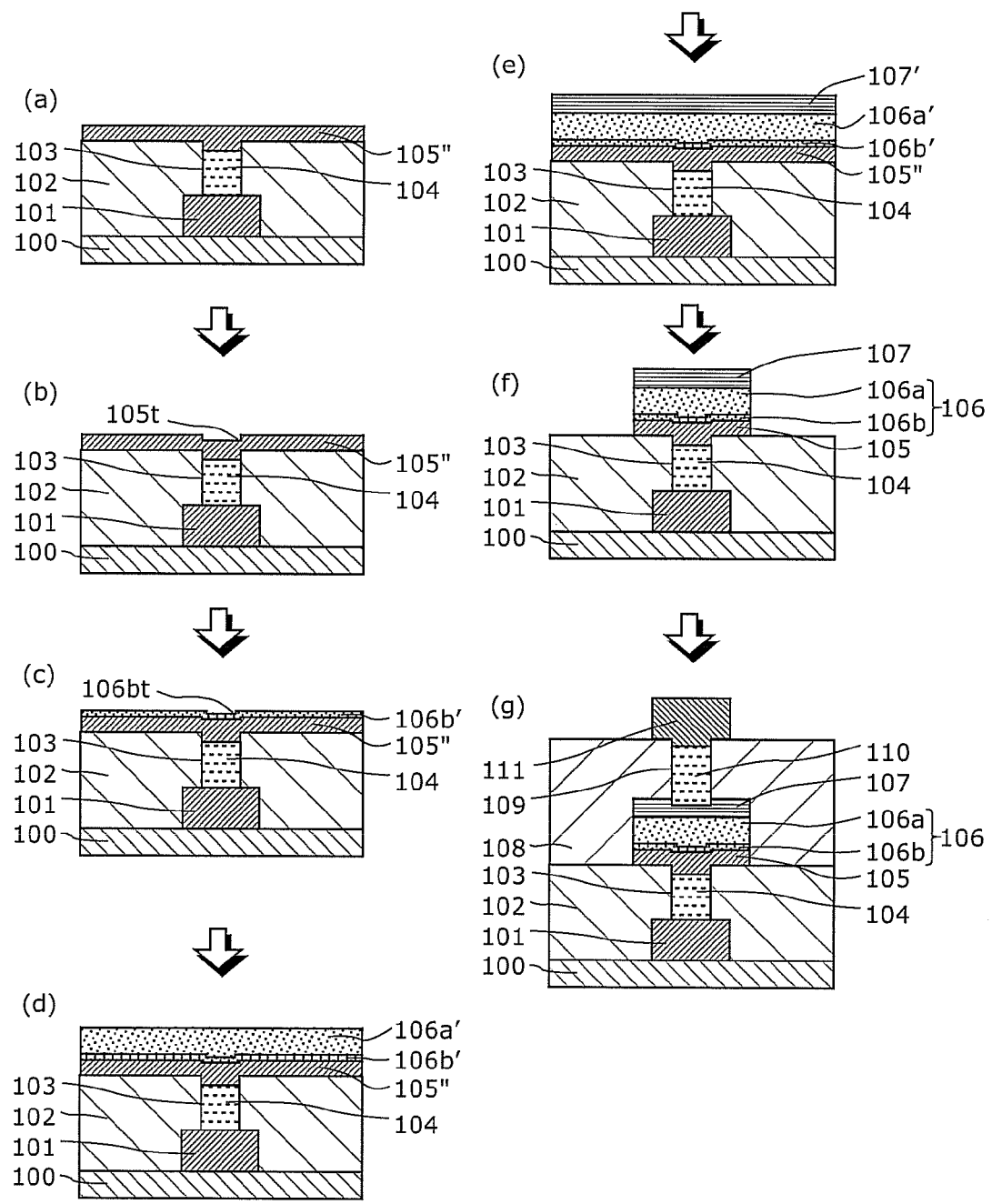
FIG. 13 (*a*) to (*g*) are cross-sectional views showing a method of manufacturing main parts of the nonvolatile memory device in Embodiment 4 of the present invention.

FIG. 13 (a) to (g) are cross-sectional views showing a method of manufacturing main parts of the nonvolatile memory device 40 in Embodiment 4 of the present invention. Furthermore, FIG. 14 (a) to (f) are plan views of the nonvolatile memory device 40 as seen from the top, corresponding to the processes shown in FIG. 13 (a) to (f), respectively. The method of manufacturing the main parts of the nonvolatile memory device 40 shall be described using these figures. Furthermore, processes prior to FIG. 13 (a) are the same as shown in FIG. 2 (a) to (f), and thus description thereof shall not be repeated.

Figure 14:
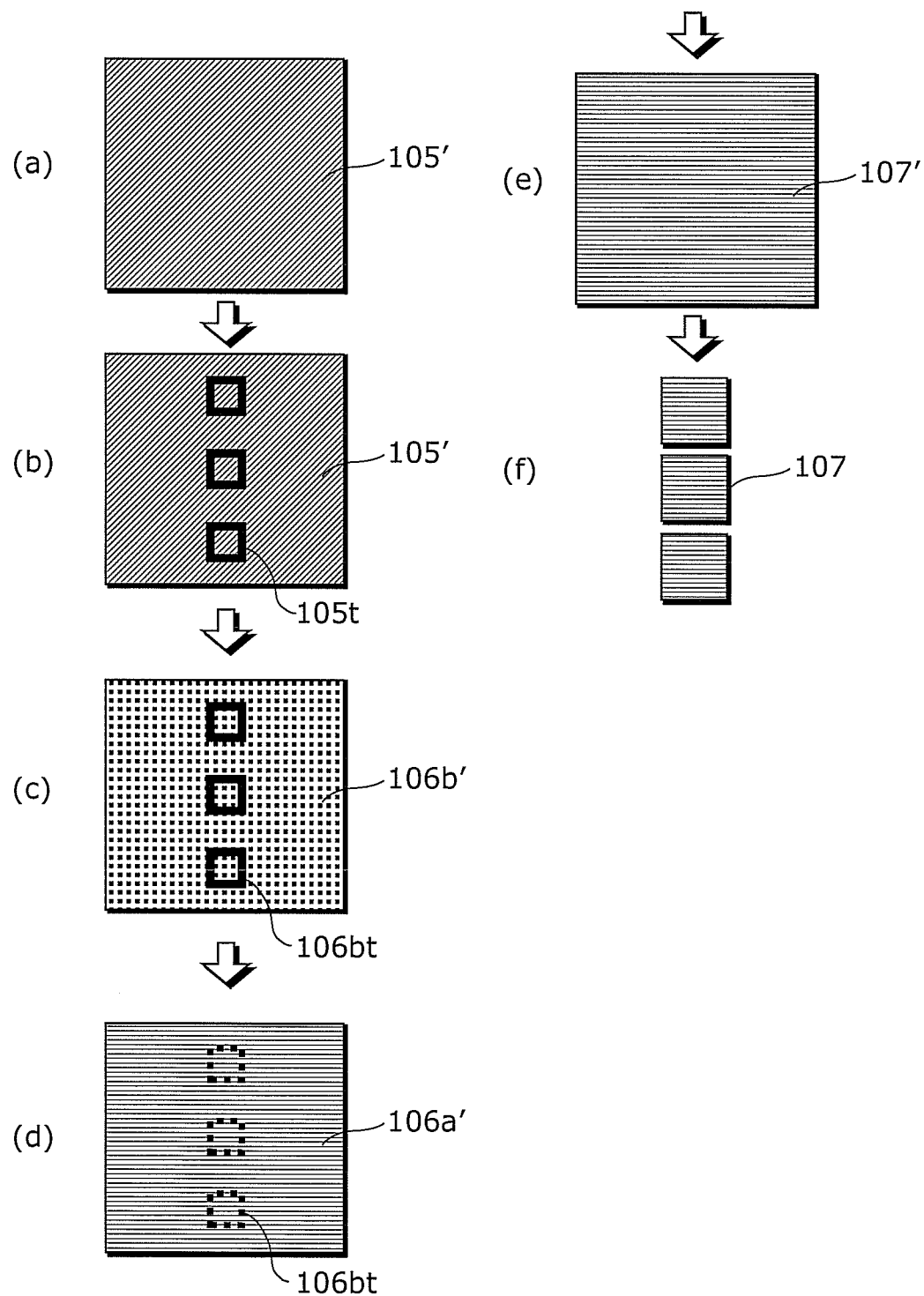
FIG. 14 (*a*) to (*f*) are plan views showing a method of manufacturing main parts of the nonvolatile memory device in Embodiment 4 of the present invention.

As shown in FIG. 13 (a) and FIG. 14 (a), in the process of forming the conductive layer 105" (the lower electrode 105), planarization polishing using the chemical mechanical polishing method (CMP method) is performed on the entire surface of the wafer to form the conductive layer 105" (film thickness: 20 to 100 nm) which becomes the lower electrode 105 after patterning.

Next, as shown in FIG. 13 (b) and FIG. 14 (b), in the process of forming the step 105t in the conductive layer 105" (the lower electrode 105), the ring-shaped step 105t (height: 1 to 30 nm) is formed, using the desired mask, in the surface of the conductive layer 105" such that one ring-shaped step 105t is always included during the subsequent forming of the variable resistance element. In order not to cause etching damage to the lower electrode 105, it is preferable that an inert gas such as Ar and the like be used as the etching gas.

Figure 15:
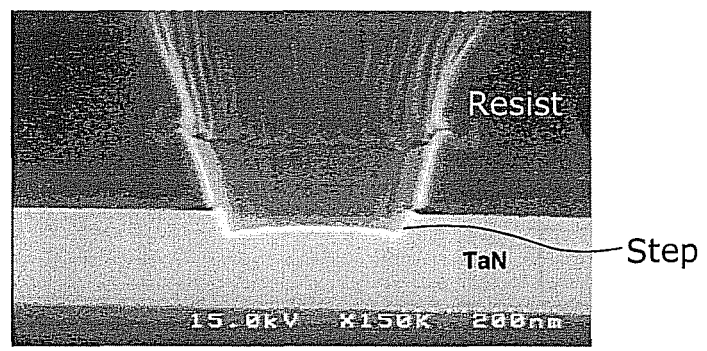
FIG. 15 is a SEM image cross-sectional view of a main part in a process in which a step is formed in the lower electrode, in the method of manufacturing the nonvolatile memory device in Embodiment 4 of the present invention.

FIG. 15 shows a cross-sectional view according to a SEM image taken immediately after the ring-shaped step 105t is formed in the conductive layer 105" (the lower electrode 105) comprising a tantalum nitride. It can be seen that the ring-shaped step 105t having a height of 20 nm and a ring diameter of 250 nm is formed using a photo resist mask.

As shown in FIG. 13 (c) and FIG. 14 (c), in the process of forming the second variable resistance layer 106b', the second variable resistance layer 106b' having a higher oxygen content than the first variable resistance layer 106a' is formed on conductive layer 105". Here, the second variable resistance layer 106b' is formed using what is called a reactive sputtering method in which sputtering is performed on a tantalum target in an oxygen gas atmosphere. The oxygen content of the second variable resistance layer 106b' is 67 to 71 atm %, the resistivity is $10^7$ mΩcm or greater, and the film thickness is 2 to 10 nm. Here, the film thickness of the bend 106bt (the film thickness on the side wall of the depressed part of the conductive layer 105") of the second variable resistance layer 106b' can be adjusted to be thin according to the height of the step 105t base (the depth of the depressed part), and a thin-film part can be formed locally in a stable manner. Furthermore, compared to the flat part of the second variable resistance layer 106b', the film property tends to become sparse in the bend 106bt of the second variable resistance layer 106b', and thus a film that allows easy breaking can be realized. Although the variable resistance layer is formed using reactive sputtering in the above-described process, a reactive sputtering method of performing sputtering on a tantalum oxide target in an oxygen gas atmosphere may be used, and the variable resistance layer may be formed using the CVD method.

Next, as shown in FIG. 13 (d) and FIG. 14 (d), in the process of forming the first variable resistance layer 106a', the first variable resistance layer 106a' comprising a transitional metal oxide is formed on the second variable resistance layer 106b'. As in the previous description, the first variable resistance layer 106a' is formed using what is called a reactive sputtering method in which sputtering is performed on a tantalum target in an argon (Ar) and oxygen gas atmosphere. The oxygen content of the first variable resistance layer 106a' is 50 to 65 atm %, the resistivity is 2 to 50 mΩcm, and the film thickness is 20 to 100 nm.

Next, as shown in FIG. 13 (e) and FIG. 14 (e), in the process of forming the conductive layer 107' (the upper electrode 107), the conductive layer 107' comprising a noble metal (platinum (Pt), iridium (Ir), palladium (Pd), and so on) which becomes the upper electrode 107 after patterning is formed on the first variable resistance layer 106a'.

Next, as shown in FIG. 13 (f) and FIG. 14 (f), in the process of forming the variable resistance element, patterning using the desired mask is performed on the conductive layer 105'', the second variable resistance layer 106b', the first variable resistance layer 106a', and the conductive layer 107' to form the variable resistance element in which the variable resistance layer 106 configured of the stacked layers of the second variable resistance layer 106b and the first variable resistance layer 106a is held between the lower electrode 105 and the upper electrode 107. As in Embodiment 3, in the case of the straight step 105s, the etching volume with the step 105s as the axis is different between the left and right and there is concern over etching left-over and base scraping due to over-etching. However, since the ring-shaped step 105t is contained inside the variable resistance element, the volume of the conductive layer 105'' to be etched does not change. In other words, etching left-over and base scraping due to over-etching do not occur easily, and thus manufacturing yield can be improved.

Lastly, as shown in FIG. 13 (g), the second interlayer insulating layer 108 (film thickness: 500 to 1000 nm) is formed covering the variable resistance element, and the second contact hole 109 and the second contact plug 110 are formed. Subsequently, the second line 111 is formed covering the second contact plug 110, and the nonvolatile memory device 40 is completed.

By adopting the above-described manufacturing method, it is possible to reflect the shape of the step of the lower electrode 105 and thereby stably form the bend 106bt in the second variable resistance layer 106b on the step 105t, and thus it is possible to cause the break phenomenon even with a low voltage, with the bend 106bt as a starting point of the initial break. Furthermore, since the step shape of the lower electrode 105 is formed in an intentional and controlled manner, the shape of the bend 106bt of the second variable resistance layer 106b is stable, and thus variation in break voltage does not increase. Therefore, lowering the break voltage and suppressing variation therein can both be achieved, and miniaturization and increased capacity of memories can be realized.

Embodiment 5

Device Configuration

FIG. 16 (a) is a cross-sectional view of a nonvolatile memory device 41 in Embodiment 5 of the present invention, FIG. 16 (b) is a plan view of the first variable resistance layer 106a included therein, and FIG. 16 (c) is a perspective view of the first variable resistance layer 106a. In FIG. 16, the same numerical references are used for elements that are the same as in FIG. 1, and description thereof shall not be repeated.

As shown in FIG. 16 (a), (b), and (c), the difference between the nonvolatile memory device 41 in Embodiment 5 and the nonvolatile memory device 10 in Embodiment 1 is in the shape of the step formed in the first variable resistance layer 106a. Specifically, in the nonvolatile memory device 10, the step 106ax formed in the surface of the first variable resistance layer 106a is a single straight step, whereas, in the nonvolatile memory device 41, the plural (two) straight steps of a step 106ax1 and a step 106ax2 formed in the surface of the first variable resistance layer 106a are formed, and a crossing point at which the plural steps cross is formed at the central part of the element. The first variable resistance layer 106a is segmented into four regions having the crossing point as a center. As the step amounts when the region in the back left of the first variable resistance layer 106a is taken as a reference, the difference with the forward left planar region of the first variable resistance layer 106a is 10 nm, the difference with the back right planer portion is 10 nm, and the difference with the forward right planar region is 20 nm.

The steps 106ax1 and 106ax2 are positioned between the first contact plug 104 and the second contact plug 110 (the first contact hole 103 and the second contact hole 109), and are parts which cause a change in elevation in the interface between the first variable resistance layer 106a and the second variable resistance layer 106b. The step 106ax1 and 106ax2 are each configured of side planes connecting a first principal plane and a second principal plane lower than the first principal plane which serve as boundary planes between the first variable resistance layer 106a and the second variable resistance layer 106b. These side planes are formed to have, for example, a 90 degree angle with respect to one or both of the first principal plane and the second principal plane.

The steps 106ax1 and 106ax2 are parts which include an inflection point at which the flatness changes abruptly in the interface between the first variable resistance layer 106a and the second variable resistance layer 106b, that is, a point at which the continuity of the flatness is interrupted. When the first variable resistance layer 106a and the second variable resistance layer 106b are seen from above or below (when seen from the side in which the upper electrode 107 or the lower electrode 105 is provided), the steps 106ax1 and 106ax2 are arranged in respective lines and cross each other in the shape of a cross. It is preferable that the steps 106ax1 and 106ax2 be formed at the approximate center in the radial direction of the first contact hole 103 and the second contact hole 109.

The bend 106bx is positioned between the first contact plug 104 and the second contact plug 110 (the first contact hole 103 and the second contact hole 109), and is a part of the second variable resistance layer 106b which bends in the stacking direction of the second variable resistance layer 106b in the cross-sectional view. The bend 106bx is provided along the step 106ax1 and 106ax2.

According to this configuration, the bend 106bx of the second variable resistance layer 106b is formed above the crossing point of the steps 106ax1 and 106ax2 of the first variable resistance layer 106a, and thus it is possible to cause the break phenomenon even with a low voltage, with the bend 106bx as a starting point of the initial break. Furthermore, the electric field is easily concentrated at the crossing point, and thus allowing the location of the break phenomenon to be fixed. Therefore, by placing the crossing point at the central part of the variable resistance element and away from the edges of the variable resistance element, a filament can be formed at a part that is minimally affected by etching damage and an oxidized region of a layer insulating film and the like. Accordingly, variation in resistance change characteristics is greatly reduced, and thus it is possible to realize a nonvolatile memory device having little bit variation and excellent manufacturing yield.

[Manufacturing Method]

Figure 17:
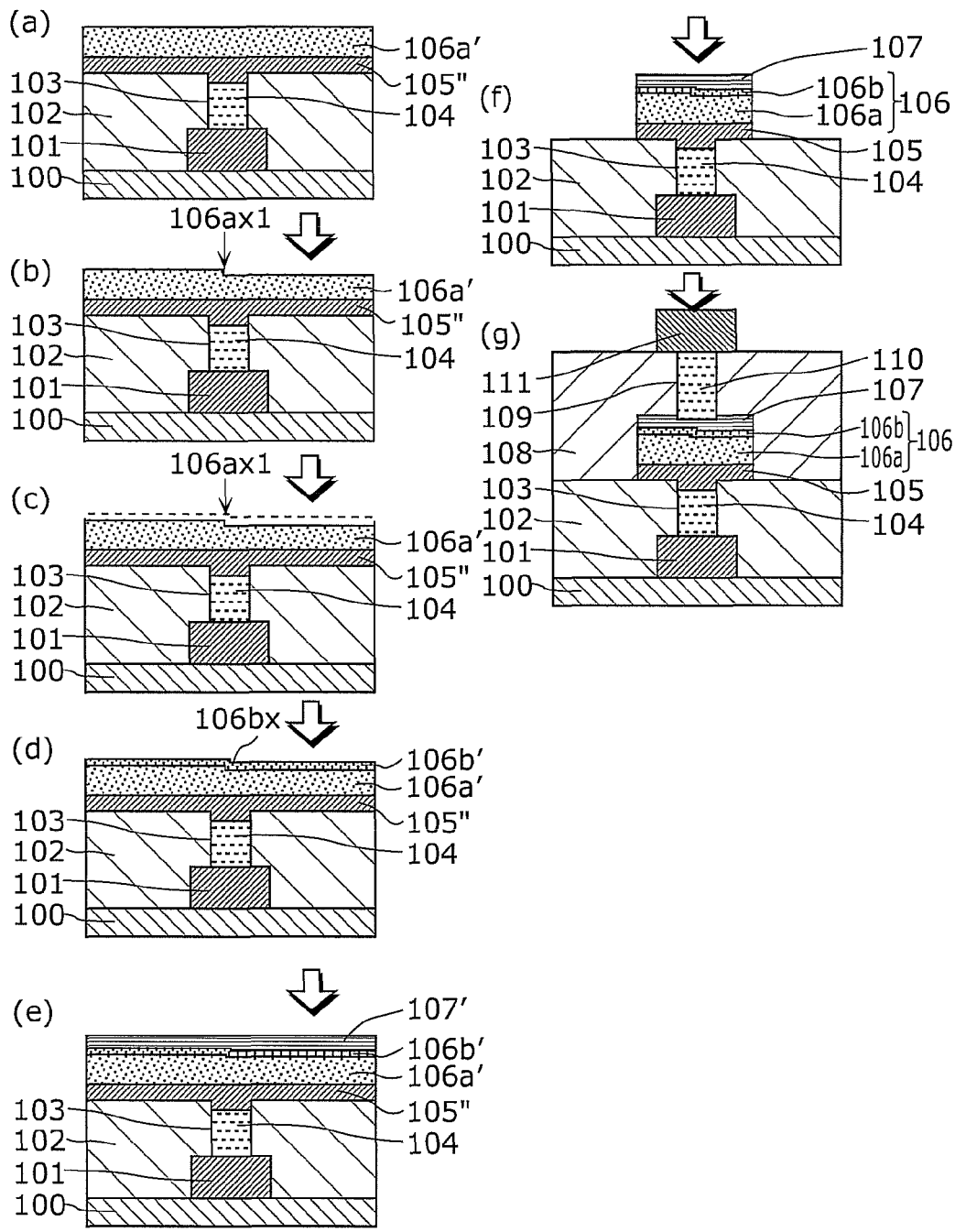
FIG. 17 (*a*) to (*g*) are cross-sectional views showing a method of manufacturing main parts of the nonvolatile memory device in Embodiment 5 of the present invention.

FIG. 17 (a) to (g) are cross-sectional views showing a method of manufacturing main parts of the nonvolatile memory device 41 in Embodiment 5 of the present invention. Furthermore, FIG. 18 (a) to (c) show perspective views of the first variable resistance layer 106a'. The method of manufacturing the main parts of the nonvolatile memory device 41 shall be described using these figures. Furthermore, processes prior to FIG. 17 (a) are the same as shown in FIG. 2 (a) to (g), and thus description thereof shall not be repeated.

Figure 18:
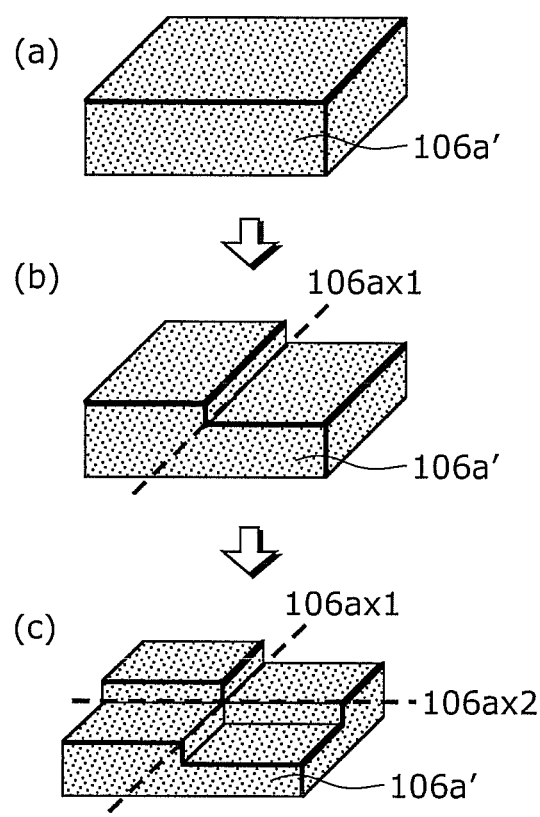
FIG. 18 (*a*) to (*c*) are perspective views showing a method of manufacturing main parts of the nonvolatile memory device in Embodiment 5 of the present invention.

As shown in FIG. 17 (a) and FIG. 18 (a), in the process of forming the first variable resistance layer 106a', the first variable resistance layer 106a' comprising a transitional metal oxide is formed on the conductive layer 105". Here, the first variable resistance layer 106a' is formed using what is called a reactive sputtering method in which sputtering is performed on a tantalum target in an argon (Ar) and oxygen gas atmosphere. The oxygen content of the first variable resistance layer 106a' is 50 to 65 atm %, the resistivity is 2 to 50 mΩcm, and the film thickness is 20 to 100 nm.

Next, as shown in FIG. 17 (b) and FIG. 18 (b), in a process of forming the step 106ax1 in the first variable resistance layer 106a', the straight (a line-shape running in the on-paper vertical direction of FIG. 17) step 106ax1 (height: 10 nm) is formed extending to an adjacent variable resistance element, using the desired mask.

Next, as shown in FIG. 17 (c) and FIG. 18(c), in a process of forming the step 106ax2 in the first variable resistance layer 106a', the straight step 106ax2 (height: 10 nm) is formed in a direction that crosses the step 106ax1 (the on-paper horizontal direction of FIG. 17), using the desired mask. With this, the two straight steps of the step 106ax1 and step 106ax2 are formed in the surface of the first variable resistance layer 106a', and thus a crossing point in which steps cross is formed at the central part of the element. Four regions having the crossing point as a center are formed in the first variable resistance layer 106a'. When the region in the back left of the first variable resistance layer 106a' is taken as a reference, a 10 nm difference in elevation is created with the forward left planar region and the back right planar region of the first variable resistance layer 106a' that have been etched once, and a 20 nm difference in elevation is created with the forward right planar region which is etched twice.

In the etching for forming the above-described steps 106ax1 and 106ax2, it is preferable that an inert gas such as Ar be used as the etching gas in order to prevent fluorine (F), and so on, included in the etching gas from entering the first variable resistance layer 106a' and causing etching damage which causes the film property of the variable resistance layer to deteriorate. Furthermore, it is also preferable to perform we etching using an etching liquid containing hydrofluoric acid (HF) and so on. In this case, the fluorine (F) included in the etching liquid does not enter the variable resistance layer, and thus the variable resistance layer does not deteriorate.

As shown in FIG. 17 (d), in the process of forming the second variable resistance layer 106b', the second variable resistance layer 106b' having a higher oxygen content than the first variable resistance layer 106a' is formed on the first variable resistance layer 106a'. In the same manner as in the first variable resistance layer 106a', the second variable resistance layer 106b' is formed with the reactive sputtering method of performing sputtering on a tantalum target in an oxygen gas atmosphere. The oxygen content of the second variable resistance layer 106b' is 67 to 71 atm %, the resistivity is $10^7$ mΩcm or greater, and the film thickness is 2 to 10 nm. The bend 106bx of the second variable resistance layer 106b' is formed above the steps 106ax1 and 106ax2 in the surface of the first variable resistance layer 106a'. Here, the film thickness of the bend 106bx (the film thickness on the side wall of the steps 106ax1 and 106ax2) of the second variable resistance layer 106b' can be adjusted to be thin according to the height of the steps 106ax1 and 106ax2 base, and a thin-film part can be formed locally in a stable manner. Furthermore, compared to the flat part of the second variable resistance layer 106b', the film property tends to become sparse in the bend 106bx of the second variable resistance layer 106b', and thus a film that allows easy breaking can be realized. Although the variable resistance layer is formed using reactive sputtering, a reactive sputtering method of performing sputtering on a tantalum oxide target in an oxygen gas atmosphere may be used, and the variable resistance layer may be formed by plasma oxidation in an atmosphere that includes oxygen.

Next, as shown in FIG. 17 (e), in the process of forming the conductive layer 107' (the upper electrode 107), the conductive layer 107' comprising a noble metal (platinum (Pt), iridium (Ir), palladium (Pd), and so on) which becomes the upper electrode 107 after patterning is formed on the second variable resistance layer 106b'.

Next, as shown in FIG. 17 (f), in the process of forming the variable resistance element, patterning using the desired mask is performed on the conductive layer 105", the first variable resistance layer 106a', the second variable resistance layer 106b', and the conductive layer 107' to form the variable resistance element in which the variable resistance layer 106 configured of the stacked layers of the first variable resistance layer 106a and the second variable resistance layer 106b is held between the lower electrode 105 and the upper electrode 107.

Lastly, as shown in FIG. 17 (g), the second interlayer insulating layer 108 (film thickness: 500 to 1000 nm) is formed covering the variable resistance element, and the second contact hole 109 and the second contact plug 110 are formed. Subsequently, the second line 111 is formed covering the second contact plug 110, and the nonvolatile memory device 41 is completed.

By adopting the above-described manufacturing method, it is possible to make use of the shape of the steps in the surface of the first variable resistance layer 106a to intentionally form, in the second variable resistance layer 106b formed in the crossing point at which the steps cross, a region where electric fields easily concentrate. By placing the crossing point at the central part of the variable resistance element and away from the edges of the variable resistance element, a filament can be formed at a part that is minimally affected by etching damage and an oxidized region of a layer insulating film and the like. Accordingly, variation in resistance change characteristics is greatly reduced, and thus it is possible to realize a nonvolatile memory device having little bit variation and excellent manufacturing yield.

It should be noted that, although the step 106ax1 and the step 106ax2 are straight-shaped in the present embodiment, they may also be ring-shaped. Furthermore, the vertical placement of the first variable resistance layer 106a and the second variable resistance layer 106b may be reversed. Specifically, the steps 106ax1 and 106ax2 may be formed in the interface between the lower electrode 105 and the second variable resistance layer 106b, and second variable resistance layer 106b may be formed covering the steps 106ax1 and 106ax2 and have the bend 106bx on the crossing point of the steps 106ax1 and 106ax2.

Embodiment 6

Device Configuration

FIG. 19 (a) is a cross-sectional view of a nonvolatile memory device 42 in Embodiment 6 of the present invention, and (b) is a plan view of the first variable resistance layer 106a included therein. In FIG. 19, the same numerical references are used for elements that are the same as in FIG. 1, and description thereof shall not be repeated.

As shown in FIGS. 19 (a) and (b), the difference between the nonvolatile memory device 42 in Embodiment 6 and the nonvolatile memory device 20 in Embodiment 2 is in the particular manner in which the ring-shaped step is shaped so that the difference between a thick-film part and a thin-film part of the second variable resistance layer 106b is further increased. In the nonvolatile memory device 20, the ring-shaped step 106ay is formed in the surface of the first variable resistance layer 106a, whereas, in the nonvolatile memory device 42, a ring-shaped step 106az, that is, a depressed part is formed in the surface of the stacked structure of the first variable resistance layer 106a and a second variable resistance layer 106b1. The ring-shaped step 106az is formed by removing a part of the first variable resistance layer 106a and the second variable resistance layer 106b1. In addition, a second variable resistance layer 106b2 is additionally-stacked to cover the ring-shaped step 106az. Accordingly, in the nonvolatile memory device 20, the localized difference in film thickness in the second variable resistance layer 106b results from the step coatability of the second variable resistance layer 106b caused by the ring-shaped step 106az and is thus small, whereas in the nonvolatile memory device 42, the second variable resistance layer 106b1 remains in the region other than the ring-shaped step 106az at the time of forming the second variable resistance layer 106b2, and thus the difference in film thickness of the second variable resistance layer 106b is bigger by as much as the film thickness of the second variable resistance layer 106b1.

The step 106az is positioned between the first contact plug 104 and the second contact plug 110 (the first contact hole 103 and the second contact hole 109), and is a part which causes a change in elevation in the interface between the first variable resistance layer 106a and the second variable resistance layer 106b. The step 106az is configured of a side plane that connects a first principal plane and a second principal plane lower than the first principal plane which serve as boundary planes between the first variable resistance layer 106a and the second variable resistance layer 106b. The step 106az is formed such that this side plane forms a 90 degree angle with respect to one or both of the first principal plane and the second principal plane.

The step 106az is the part which includes an inflection point at which the flatness changes abruptly in the interface between the first variable resistance layer 106a and the second variable resistance layer 106b, that is, a point at which the continuity of the flatness is interrupted. When the first variable resistance layer 106a and the second variable resistance layer 106b are seen from above or below (when seen from the side in which the upper electrode 107 or the lower electrode 105 is provided), the step 106az is arranged in a ring-shape. It is preferable that the center of the ring-shaped step 106az be formed at the approximate center in the radial direction of the first contact hole 103 and the second contact hole 109.

The bend 106by is positioned between the first contact plug 104 and the second contact plug 110 (the first contact hole 103 and the second contact hole 109), and is configured of a part of the second variable resistance layer 106b which bends in the stacking direction of the first variable resistance layer 106a and the second variable resistance layer 106b in the cross-sectional view. The bend 106by is provided along the step 106az, and is and is configured of a part above the side plane of the step 106az.

According to this configuration, the bend 106by is formed in the second variable resistance layer 106b, and thus it is possible to cause the break phenomenon even with a low voltage, with the bend 106by as a starting point of the initial break. Furthermore, since the second variable resistance layer 106b1 remains in the region other than the ring-shaped step 106az at the time of forming the second variable resistance layer 106b2, it is possible to increase the film thickness of the second variable resistance layer 106b and significantly reduce leak currents, and thus voltage can be more reliably applied to the cell and further lowering of the break voltage becomes possible. With this, lowering the break voltage and suppressing variation therein can both be achieved, and miniaturization and increased capacity of memories can be realized.

[Manufacturing Method]

Figure 20:
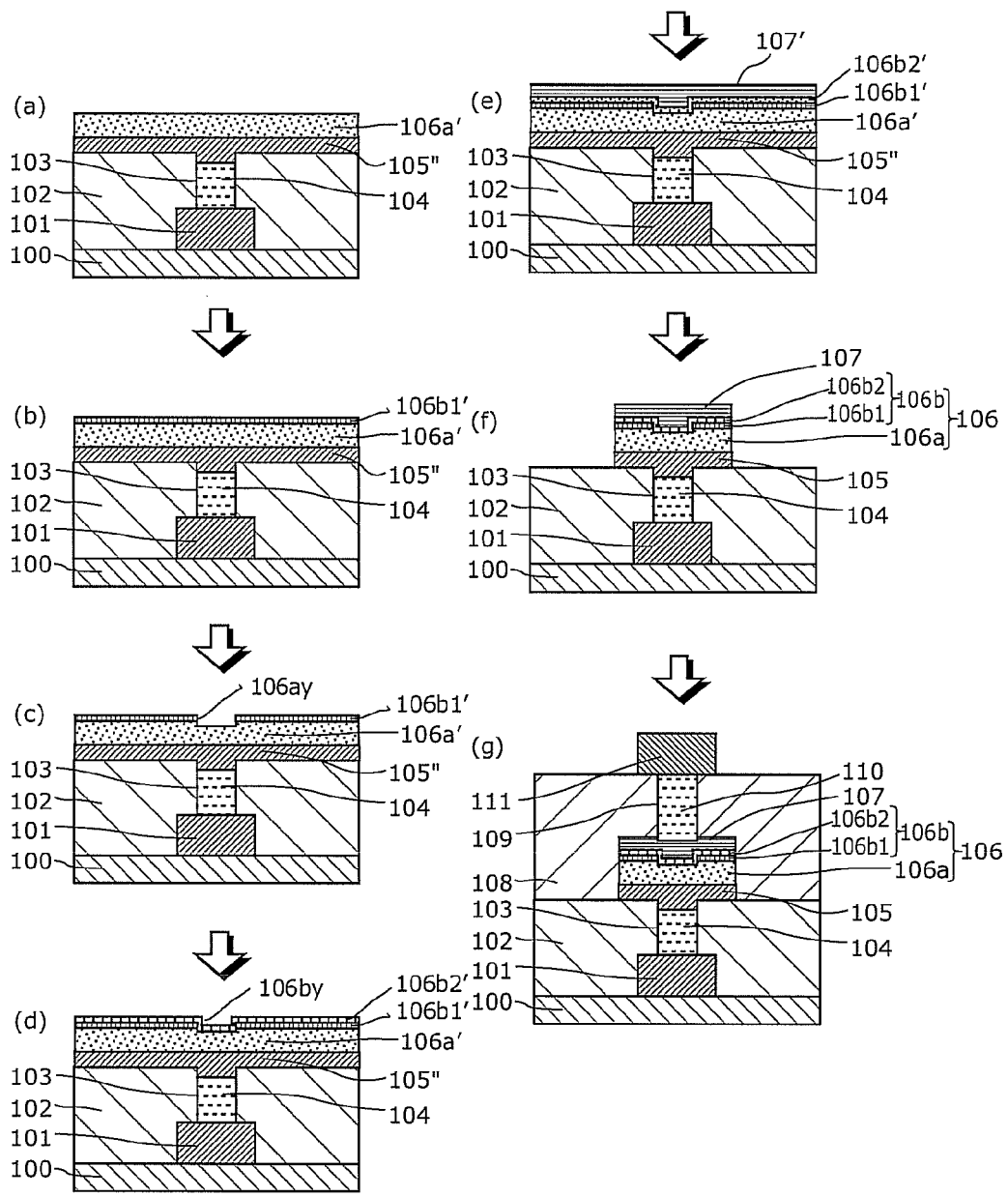
FIG. 20 (*a*) to (*g*) are cross-sectional views showing a method of manufacturing main parts of the nonvolatile memory device in Embodiment 6 of the present invention.

FIG. 20 (a) to (g) are cross-sectional views showing a method of manufacturing main parts of the nonvolatile memory device 42 in Embodiment 6 of the present invention. The method of manufacturing the main parts of the nonvolatile memory device 42 shall be described using this figure. Furthermore, processes prior to FIG. 20 (a) are the same as shown in FIG. 2 (a) to (g), and thus description thereof shall not be repeated.

As shown in FIG. 20 (a), in the process of forming the first variable resistance layer 106a', the first variable resistance layer 106a' comprising a first transitional metal oxide is formed on the conductive layer 105". Here, the first variable resistance layer 106a' is formed using what is called a reactive sputtering method in which sputtering is performed on a tantalum target in an argon (Ar) and oxygen gas atmosphere. The oxygen content of the first variable resistance layer 106a' is 50 to 65 atm %, the resistivity is 2 to 50 mΩcm, and the film thickness is 20 to 100 nm.

As shown in FIG. 20 (b), in a process of forming the second variable resistance layer 106b1', the second variable resistance layer 106b1' comprising a second transitional metal oxide having a higher oxygen content than the first transitional metal oxide (first variable resistance layer 106a') is formed on the first variable resistance layer 106a'. In the same manner as in the first variable resistance layer 106a', the second variable resistance layer 106b1' is formed with the reactive sputtering method of performing sputtering on a tantalum target in an oxygen gas atmosphere. The oxygen content of the second variable resistance layer 106b1' is 67 to 71 atm %, the resistivity is $10^7$ mΩcm or greater, and the film thickness is 2 to 10 nm. Although the variable resistance layer is formed using reactive sputtering, a reactive sputtering method of performing sputtering on a tantalum oxide target in an oxygen gas atmosphere may be used, and the variable resistance layer may be formed by plasma oxidation in an atmosphere that includes oxygen.

Next, as shown in FIG. 20 (c), in a process of forming the step 106ay in the stacked structure of the first variable resistance layer 106a' and the second variable resistance layer 106b1' (the surface of the second variable resistance layer 106b1'), the ring-shaped step 106ay (height: 2 to 30 nm) is formed, using the desired mask, such that one ring-shaped step 106ay is always included during the subsequent forming of the variable resistance element (during the forming of the second variable resistance layer 106b'). In this case, in the ring-shaped step 106ay, the second variable resistance layer 106b1' is certainly removed, that is, a through-hole that reaches up to the first variable resistance layer 106a' is formed in the second variable resistance layer 106b1', and a part of the first variable resistance layer 106a' is removed. Furthermore, on this occasion, it is preferable that an inert gas such as Ar be used as the etching gas in order to prevent fluorine (F), and so on, included in the etching gas from entering the first variable resistance layer 106a' and causing etching damage which causes the film property of the variable resistance layer to deteriorate. Furthermore, it is also preferable to perform we etching using an etching liquid containing hydrofluoric acid (HF) and so on. In this case, the fluorine (F) included in the etching liquid does not enter the variable resistance layer, and thus the variable resistance layer does not deteriorate.

Next, as shown in FIG. 20 (d), in a process of forming the second variable resistance layer 106b2', the second variable resistance layer 106b2' comprising a second transitional metal oxide having a higher oxygen content than the first transitional metal oxide is formed on the ring-shaped step 106ay of the second variable resistance layer 106b1' and the first variable resistance layer 106a'. In this case, the second variable resistance layer 106b2' is additionally stacked on the second variable resistance layer 106b1' and the first variable resistance layer 106a' and covering the step 106ay. The film forming method is the same as in the second variable resistance film 106b1'. The bend 106by of the second variable resistance layer 106b2' is formed on the ring-shaped step 106ay. Compared to the film thickness of the second variable resistance layer 106b2' inside the ring-shaped step 106ay, the difference in the film thickness of the second variable resistance layer 106b is increased by as much as the film thickness of the second variable resistance layer 106b1' remaining in the region other than the ring-shaped step ay at the time of forming the second variable resistance layer 106b2.

Next, as shown in FIG. 20 (e), in the process of forming the conductive layer 107' (the upper electrode 107), the conductive layer 107' comprising a noble metal (platinum (Pt), iridium (Ir), palladium (Pd), and so on) which becomes the upper electrode 107 after patterning is formed on the second variable resistance layer 106b'.

Next, as shown in FIG. 20 (f), in the process of forming the variable resistance element, patterning using the desired mask is performed on the conductive layer 105", the first variable resistance layer 106a', the second variable resistance layer 106b', and the conductive layer 107' to form the variable resistance element in which the variable resistance layer 106 configured of the stacked layers of the first variable resistance layer 106a and the second variable resistance layer 106b is held between the lower electrode 105 and the upper electrode 107. As in Embodiment 1, in the case of the straight step 106ax, the etching volume with the step 106ax as the axis is different between the left and right and there is concern over etching left-over and base scraping due to over-etching. However, since the ring-shaped step 106ay is contained inside the variable resistance element, the volume of the first variable resistance layer 106a to be etched does not change. In other words, etching left-over and base scraping due to over-etching do not occur easily, and thus manufacturing yield can be improved.

Lastly, as shown in FIG. 20 (g), the second interlayer insulating layer 108 (film thickness: 500 to 1000 nm) is formed covering the variable resistance element, and the second contact hole 109 and the second contact plug 110 are formed. Subsequently, the second line 111 is formed covering the second contact plug 110, and the nonvolatile memory device 42 is completed.

By adopting the above-described manufacturing method, it is possible to reflect the shape of the step of the surface of the first variable resistance layer 106a and thereby stably form the bend 106by in the second variable resistance layer 106b on the step 106ay, and thus it is possible to cause the break phenomenon even with a low voltage, with the bend 106by as a starting point of the initial break. Furthermore, since the step shape of the first variable resistance layer 106a is formed in an intentional and controlled manner, the shape of the bend 106by of the second variable resistance layer 106b is stable, and thus variation in initial break voltage does not increase. Furthermore, since the second variable resistance layer 106b1 remains in the region other than the ring-shaped step 106az at the time of forming the second variable resistance layer 106b2, it is possible to increase the film thickness of the second variable resistance layer 106b and significantly reduce leak currents, and thus voltage can be more reliably applied to the cell and further lowering of the break voltage becomes possible. Therefore, lowering the break voltage and suppressing variation therein can both be achieved, and miniaturization and increased capacity of memories can be realized.

It should be noted that, in the present embodiment, the vertical placement of the first variable resistance layer 106a and the second variable resistance layer 106b may be reversed. Furthermore, plural steps may be formed in the surface of the first variable resistance layer 106a.

Embodiment 7

When a memory array is configured by two-dimensionally arranging memory cells each of which having the nonvolatile memory device described in the above-described Embodiments 1 to 6, there are cases where resistance change is caused only in a predetermined memory cell (selected memory cell) and resistance change is prevented in the rest of the memory cells (non-selected memory cells). In such a case, each of the memory cells are configured by connecting a diode element in series to the variable resistance element, and it is sufficient to turn ON the diode element of the predetermined memory cell and turn OFF the respective diode elements of the rest of the memory cells. In this case, it is necessary to add a voltage portion to be distributed to the diode element, and thus raise the voltage to be applied to the memory cell. As such, the demand for lowering voltage is even greater.

In the nonvolatile memory device in the present embodiment, it is possible to lower the break voltage of the variable resistance element, and thus the voltage applied to the memory cell can be lowered. Furthermore, in the structures of the respective embodiments described earlier, the break phenomenon of the variable resistance element occurs locally, and thus transient current flowing at the time of the break can be reduced. With this, destruction of the diode element can also be prevented.

These shall be described in detail below.

[Device Configuration]

FIG. 21 (a) is a cross-sectional view of a nonvolatile memory device 44 in Embodiment 7 of the present invention, and (b) is a plan view of the first variable resistance layer 106a included therein. In FIG. 21, the same numerical references are used for elements that are the same as in FIG. 1, and description thereof shall not be repeated.

As shown in FIGS. 21 (a) and (b), the difference between the nonvolatile memory device 44 in Embodiment 7 and the nonvolatile memory device 10 in Embodiment 1 is that a lower electrode 112 of a diode element, a semiconductor layer 113, and an upper electrode 114 of the diode element, that is, a diode element is built-in below the variable resistance element. In other words, in the nonvolatile memory device 44, the element is formed by integrating the variable resistance element and the diode element.

Although the nonvolatile memory device 44 has a structure in which the upper electrode 114 of the diode element and the bottom electrode 105 of the variable resistance element are shared, these electrodes may be configured separately. Here, the surface of the lower electrode 112 of the diode element is planarized, and the surface of the element film of the semiconductor layer 113 formed above it is formed to be approximately flat. Furthermore, as in the nonvolatile memory device 10, the straight step 106*ax* is formed in the surface of the first variable resistance layer 106*a*.

According to this configuration, although the lower electrode 112 of the diode element is also formed in the part of the recess created above the first contact plug 104 inside the first contact hole 103, the surface of the lower electrode 112 of the diode element is formed flat. Since the semiconductor layer 113 can be formed on a planarized base, variation in the film thickness thereof can be greatly reduced, and it is possible to obtain stable rectifying characteristics of an MSM diode in which the semiconductor layer 113 is held between upper and lower electrodes. Meanwhile, in the variable resistance element, the bend 106*bx* of the second variable resistance layer 106*b* is formed above the step 106*ax* of the first variable resistance layer 106*a*, and thus it is possible, through electric field concentration, to cause the initial break phenomenon even with a low voltage, with the bend 106*bx* as a starting point of the initial break. Furthermore, since the step shape of the first variable resistance layer 106*a* is formed in an intentional and controlled manner, the shape of the bend 106*bx* of the second variable resistance layer 106*b* is stable, and thus variation in break voltage does not increase.

With such a memory cell structure in which the variable resistance element and the diode element are connected in series, the break voltage of the variable resistance element can be lowered, and thus the voltage applied to the memory cell can be lowered. Furthermore, since the break phenomenon of the variable resistance element occurs locally, transient current flowing at the time of the break can be reduced. With this, destruction of the diode element can also be prevented.

[Manufacturing Method]

Figure 22:
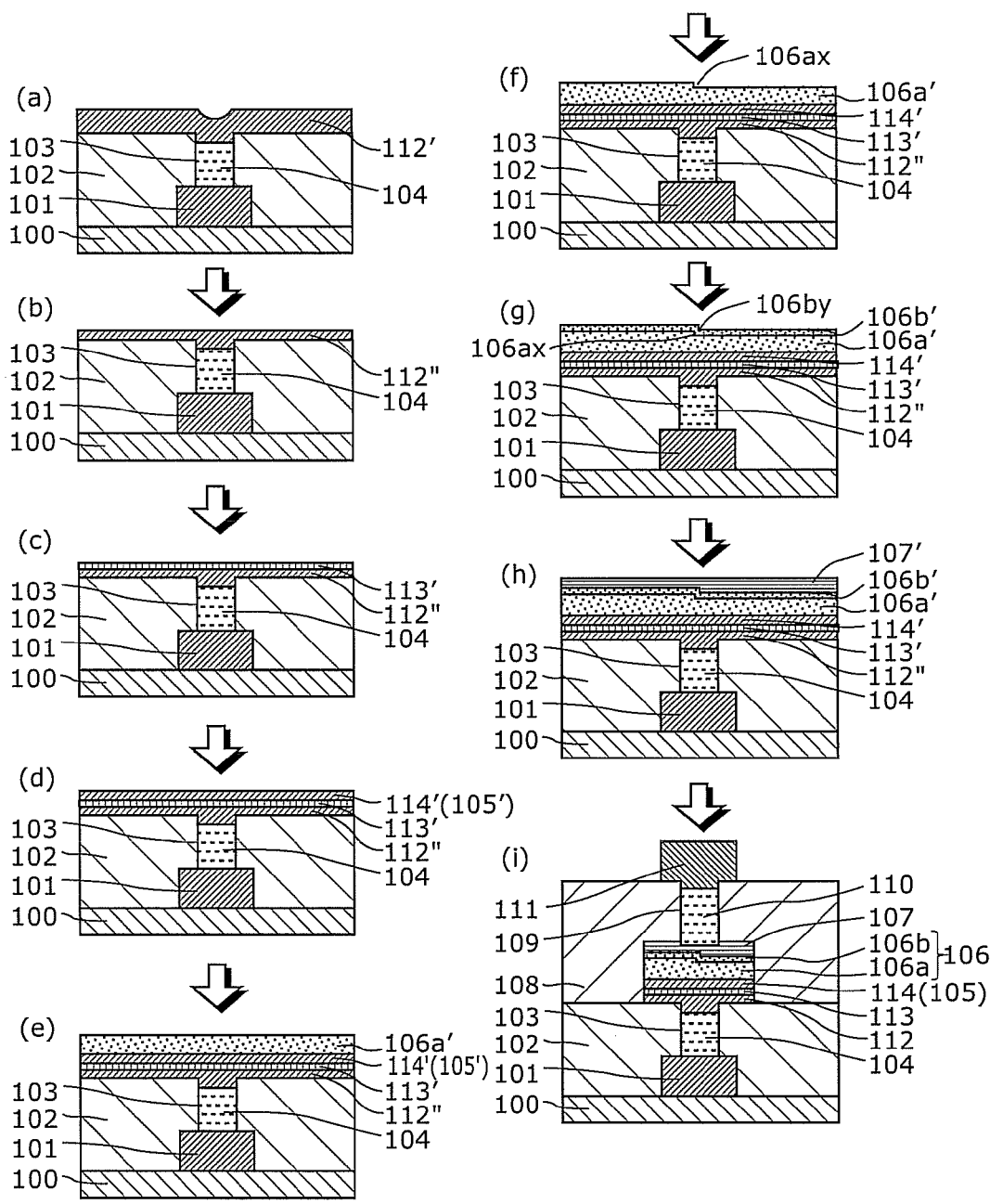
FIG. 22 (*a*) to (*i*) are cross-sectional views showing a method of manufacturing main parts of the nonvolatile memory device in Embodiment 7 of the present invention.

FIG. 22 (*a*) to (*i*) are cross-sectional views showing a method of manufacturing main parts of the nonvolatile memory device 44 in Embodiment 7 of the present invention. The method of manufacturing the main parts of the nonvolatile memory device 44 shall be described using this figure. Furthermore, processes prior to FIG. 22 (*a*) are the same as shown in FIG. 2 (*a*) to (*e*), and thus description thereof shall not be repeated.

As shown in FIG. 22 (*a*), in a process of forming a conductive layer 112' (the lower electrode 112) of the diode element, the conductive layer 112' (film thickness: 50 to 200 nm) comprising a tantalum nitride and which later becomes the lower electrode 112 of the diode element is formed with the sputtering method, on the first interlayer insulating layer 102 and covering the first contact plug 104. The conductive layer 112' is also formed in the part of the recess created above the first contact plug 104 inside the first contact hole 103. Furthermore, a depression reflecting the shape of the base is created in the top plane of the conductive layer 105' on the first contact plug 104.

Next, as shown in FIG. 22 (*b*), in a process of forming the lower electrode 112 of the diode element, planarization polishing using the chemical mechanical polishing method (CMP method) is performed on the entire surface of the wafer to form the conductive layer 112" (film thickness: 20 to 100 nm) which becomes the lower electrode 112 of the diode element after patterning. The point of this process is to perform planarization polishing on the conductive layer 112' until the above-described depression created in FIG. 22 (*a*) disappears, and to leave behind the entire conductive layer 112". According to such a manufacturing method, the step created on the first contact plug 4 is not transferred onto the surface of the conductive layer 112", and thus the lower electrode 112 is extremely flat throughout the entire surface, and a continuous plane can be maintained. This is because, unlike when the contact plug 104 is formed, what is polished is always the same type of material because the polishing of the conductive layer 112" is stopped along the way, and thus, in principle, the difference in polishing rates in the CMP method can be avoided.

Next, as shown in FIG. 22 (*c*), in a process of forming a semiconductor layer 113' of the diode element, the semiconductor layer 113' is deposited on the conductive layer 112". The semiconductor layer 113' is formed by depositing, for example, 5 to 30 nm of silicon nitride using the sputtering method.

Next, as shown in FIG. 22 (*d*), in a process of forming a conductive layer 114' (the upper electrode 114) of the diode element, the conductive layer 114' which becomes the upper electrode of the diode element is deposited on the semiconductor layer 113'. The conductive layer 114' which becomes the upper electrode 114 of the diode element is formed by depositing, for example, 20 to 50 nm of tantalum nitride using the sputtering method. The upper electrode 114 of the diode element also serves as the lower electrode 105 of the variable resistance element.

As shown in FIG. 22 (*e*), in the process of forming the first variable resistance layer 106*a'*, the first variable resistance layer 106*a'* comprising a transitional metal oxide is formed on the conductive layer 114' (the conductive layer 105'). Here, the first variable resistance layer 106*a'* is formed using what is called a reactive sputtering method in which sputtering is performed on a tantalum target in an argon (Ar) and oxygen gas atmosphere. The oxygen content of the first variable resistance layer 106*a'* is 50 to 65 atm %, the resistivity is 2 to 50 mΩcm, and the film thickness is 20 to 100 nm.

Next, as shown in FIG. 22 (*f*), in the process of forming the step 106*ax* in the first variable resistance layer 106*a'*, the straight step 106*ax* (height: 1 to 30 nm) is formed, using the desired mask, in the surface of the first variable resistance layer 106*a'* and extending to an adjacent variable resistance element. On this occasion, it is preferable that an inert gas such as Ar be used as the etching gas in order to prevent fluorine (F), and so on, included in the etching gas from entering the first variable resistance layer 106*a'* and causing etching damage which causes the film property of the variable resistance layer to deteriorate. Furthermore, it is also preferable to perform we etching using an etching liquid containing hydrofluoric acid (HF) and so on. In this case, the fluorine (F) included in the etching liquid does not enter the variable resistance layer, and thus the variable resistance layer does not deteriorate.

As shown in FIG. 22 (*g*), in the process of forming the second variable resistance layer 106*b'*, the second variable resistance layer 106*b'* having a higher oxygen content than the first variable resistance layer 106*a'* is formed on the first variable resistance layer 106*a'*. In the same manner as in the first variable resistance layer 106*a'*, the second variable resistance layer 106*b'* is formed with the reactive sputtering method of performing sputtering on a tantalum target in an oxygen gas atmosphere. The oxygen content of the second variable resistance layer 106b' is 67 to 71 atm %, the resistivity is $10^7$ mΩcm or greater, and the film thickness is 2 to 10 nm. The bend 106bx of the second variable resistance layer 106b' is formed above the step 106ax in the surface of the first variable resistance layer 106a'. Here, the film thickness of the bend 106bx (the film thickness on the side wall of the step 106ax) of the second variable resistance layer 106b' can be adjusted to be thin according to the height of the step 106ax base, and a thin-film part can be formed locally in a stable manner. Furthermore, compared to the flat part of the second variable resistance layer 106b', the film property tends to become sparse in the bend 106bx of the second variable resistance layer 106b', and thus a film that allows easy breaking can be realized. Although the variable resistance layer is formed using reactive sputtering, a reactive sputtering method of performing sputtering on a tantalum oxide target in an oxygen gas atmosphere may be used, and the variable resistance layer may be formed by plasma oxidation in an atmosphere that includes oxygen.

Next, as shown in FIG. 22 (h), in the process of forming the conductive layer 107' (the upper electrode 107), the conductive layer 107' comprising a noble metal (platinum, iridium, palladium, and so on) which becomes the upper electrode 107 after patterning is formed on the second variable resistance layer 106b'.

Lastly, as shown in FIG. 22 (i), in the process of forming the variable resistance element and the diode element, patterning using the desired mask is performed on the conductive layer 112", the semiconductor layer 113', the conductive layer 114', the first variable resistance layer 106a', the second variable resistance layer 106b', and the conductive layer 107' to integrally form (i) the diode element in which the semiconductor layer 113 is held between electrodes and (ii) the variable resistance element in which the variable resistance layer 106 configured of stacked layers is held between electrodes. Although, in the present process, patterning is performed collectively using the same mask, patterning may be performed on a per process basis (a per different layer basis). In addition, the second interlayer insulating layer 108 (film thickness: 500 to 1000 nm) is formed covering the variable resistance element and the diode element, and the second contact hole 109 and the second contact plug 110 are formed according to the same manufacturing method as shown in FIGS. 2 (b) and (c). Subsequently, the second line 111 is formed covering the second contact plug 110, and the non-volatile memory device 44 is completed.

By adopting the above-described manufacturing method, it is possible to realize, in a memory cell structure in which the variable resistance element and the diode element are connected in series, an element which allows the break voltage of the variable resistance element to be lowered. Since the break voltage of the variable resistance element can be lowered, it is possible to reduce the voltage applied to the entire cell. Furthermore, since the break phenomenon of the variable resistance element occurs locally in the bend 106bx, transient current flowing at the time of the break can be reduced. With this, destruction of the diode element can also be prevented.

It should be noted that although the present embodiment describes an example in which the diode element is placed below the first variable resistance layer 106a in the configuration in Embodiment 7 (FIG. 21), the same operation and effect as in Embodiment 7 can be produced even with a configuration (modification) in which a lower electrode 127, the semiconductor layer 113, and an upper electrode 128 are placed above the first variable resistance layer 106a in the configuration in Embodiment 3 (FIG. 9), as shown in FIG. 23. In this case, it is preferable to perform, on the upper electrode 107, the chemical mechanical polishing method (CMP method) to eliminate the transferring of the step 105s of the variable resistance layer 106.

Furthermore, although the step 106ax is straight-shaped in the present embodiment, the step 106ax may have the ring shape described in Embodiment 2, Embodiment 4, and embodiment 5. Furthermore, plural steps may be formed in the surface of the first variable resistance layer 106a. The above described details may also be applied in the same manner in the modification shown in FIG. 23 mentioned above.

Moreover, as described in Embodiment 6, the ring-shaped step 106ax may be formed after forming the stacked layers of the first variable resistance layer 106a and the second variable resistance layer 106b' (the second variable resistance layer 106b1). The second variable resistance layer 106b may be formed by additionally stacking the second variable resistance layer 106b' (106b2) to cover the step 106ax.

Modifications of Embodiments 1 to 7

Although, in the respective embodiments described above, the metal oxide layer is configured of a stacked structure of tantalum oxide layers, the above described operation and effect of the present invention are manifested not only in the case of tantalum oxide layers, and thus the present invention is not limited to the above configuration. For example, the metal oxide layer may be configured of a different metal oxide layer (transitional metal oxide layer) such as a stacked structure of hafnium (Hf) oxide layers or a stacked structure of zirconium (Zr) oxide layers.

For example, in the case of adopting a stacked structure of hafnium oxide layers, when the composition of a first hafnium oxide layer is $HfO_x$ and the composition of a second hafnium oxide layer is $HfO_y$, it is preferable that x approximately satisfies $0.9 \leq x \leq 1.6$ and y approximately satisfies $1.8 < y < 2.0$, and that the film thickness of the second hafnium oxide layer be between 3 nm and 4 nm, inclusive.

Furthermore, in the case of adopting a stacked structure of zirconium oxide layers, when the composition of a first zirconium oxide layer is $ZrO_x$ and the composition of a second zirconium oxide layer is $ZrO_y$, it is preferable that x approximately satisfies $0.9 \leq x \leq 1.4$ and y approximately satisfies $1.9 < y < 2.0$, and that the film thickness of the second zirconium oxide layer be between 1 nm and 5 nm, inclusive.

Furthermore, in the case of adopting hafnium oxide layers, the first hafnium oxide layer is formed on the lower electrode with what is called the reactive sputtering method in which sputtering is performed in an argon gas and oxygen gas atmosphere using a Hf target. The second hafnium oxide layer can be formed after the forming of the first hafnium oxide layer, by exposing the surface of the first hafnium oxide layer to argon gas and oxygen gas plasma. The oxygen content of the first hafnium oxide layer is the same as in the case of the above-described tantalum oxide layer, and can be easily adjusted by changing the flow ratio of the oxygen gas to the argon gas in the reactive sputtering. It should be noted that, with regard to the substrate temperature, heating is not necessary and room temperature is acceptable.

Furthermore, the film thickness of the second hafnium oxide layer can be easily adjusted through the exposure time to the argon gas and oxygen gas plasma. When the composition of the first hafnium oxide layer is $HfO_x$ and the composition of the second hafnium oxide layer is $HfO_y$, it is possible to realize stable resistance change characteristics when $0.9 \leq x \leq 1.6$ and $1.8 < y < 2.0$, and the film thickness of the second hafnium oxide layer is within a range of 3 nm to 4 nm, inclusive.

In the case of adopting zirconium oxide layers, the first zirconium oxide layer is formed on the lower electrode with what is called the reactive sputtering method in which sputtering is performed in an argon gas and oxygen gas atmosphere using a Zr target. The second zirconium oxide layer can be formed after the forming of the first zirconium oxide layer, by exposing the surface of the first zirconium oxide layer to argon gas and oxygen gas plasma. The oxygen content of the first zirconium oxide layer is the same as in the case of the above-described tantalum oxide layer, and can be easily adjusted by changing the flow ratio of the oxygen gas to the argon gas in the reactive sputtering. It should be noted that, with regard to the substrate temperature, heating is not necessary and room temperature is acceptable.

Furthermore, the film thickness of the second zirconium oxide layer can be easily adjusted through the exposure time to the argon gas and oxygen gas plasma. When the composition of the first zirconium oxide layer is $ZrO_x$ and the composition of the second hafnium oxide layer is $ZrO_y$, it is possible to realize stable resistance change characteristics when $0.9 \leq x \leq 1.4$ and $1.9 < y < 2.0$, and the film thickness of the second zirconium oxide layer is within a range of 1 nm to 5 nm, inclusive.

Furthermore, the respective materials of the upper electrode and the lower electrode described in Embodiments 1 to 7 are examples, and other materials may be used. For example, aside from Pt, Ir, and Pd, gold (Au), copper (Cu), silver (Ag), and so on, may be used as an upper electrode, and, aside from TaN, tungsten (W), nickel (Ni), and so on, may be used as a lower electrode.

Furthermore, providing a bend in the second variable resistance layer in Embodiments 1 to 7 includes the case where the step in the interface between the first variable resistance layer and the second variable resistance layer is transferred onto a position in the surface of the second variable resistance layer that corresponds to such step. Furthermore, in the second variable resistance layer, the film thickness in the bend may be thinner than in the other parts of the second variable resistance layer, or may be the same as in the other parts.

INDUSTRIAL APPLICABILITY

The present invention provides a variable resistance nonvolatile memory device and a method of manufacturing the same, and is useful in various electronic device fields that use a nonvolatile memory because the present invention can realize a nonvolatile memory which operates in a stable manner and is highly reliable.

REFERENCE SIGNS LIST

10, 20, 30, 40, 41, 42, 43, 44, 50, 60 Nonvolatile memory device
100 Substrate
101 First line
102 First interlayer insulating layer
103 First contact hole
104 First contact plug
104', 105', 105", 107', 112', 112", 114' Conductive layer
105, 112, 127 Lower electrode
105s, 105t, 106ax, 106ay, 106ax1, 106ax2, 106az Step
106 Variable resistance layer
106a, 106a' First variable resistance layer (low oxygen content layer, low resistance layer)
106b, 106b' 106b1, 106b2 Second variable resistance layer (high oxygen content layer, high resistance layer)
106bx, 106by, 106bs, 106bt Bend
107, 114, 128 Upper electrode
108 Second interlayer insulating layer
109 Second contact hole
110 Second contact plug
111 Second line

The invention claimed is:

1. A nonvolatile memory device comprising:
   a substrate;
   a lower electrode formed above said substrate;
   a second variable resistance layer formed above said lower electrode and comprising a second transitional metal oxide;
   a first variable resistance layer formed above said second variable resistance layer and comprising a first transitional metal oxide having an oxygen content that is lower than an oxygen content of the second transitional metal oxide; and
   an upper electrode formed above said first variable resistance layer,
   wherein a step is formed in an interface between said lower electrode and said second variable resistance layer, and
   wherein said second variable resistance layer is formed covering the step and has a bend above the step.

2. The nonvolatile memory device of claim 1, wherein the bend of said second variable resistance layer is straight-shaped when said second variable resistance layer is seen from above.

3. The nonvolatile memory device of claim 1, wherein the bend of said second variable resistance layer is ring-shaped when said second variable resistance layer is seen from above.

4. The nonvolatile memory device of claim 1, wherein the step includes plural steps, and there is a crossing point at which the plural steps cross each other.

5. The nonvolatile memory device of claim 1, wherein the first transitional metal oxide and the second transitional metal oxide each comprise an oxide of tantalum, hafnium, or zirconium.

6. The nonvolatile memory device of claim 1, wherein a diode element is formed in contact with said lower electrode or said upper electrode.

7. A method of manufacturing a nonvolatile memory device, said method comprising:
   forming a lower electrode above a substrate;
   forming a step in a surface of the lower electrode;
   forming a second variable resistance layer to cover the step of the lower electrode and have a bend above the step, the second variable resistance layer comprising a second transitional metal oxide;
   forming a first variable resistance layer above the second variable resistance layer, the first variable resistance layer comprising a first transitional metal oxide having an oxygen content that is lower than an oxygen content of the second transitional metal oxide; and
   forming an upper electrode above the first variable resistance layer.

8. The method of claim 7, wherein the bend of said second variable resistance layer is straight-shaped when said second variable resistance layer is seen from above.

9. The method of claim 7, wherein the bend of said second variable resistance layer is ring-shaped when said second variable resistance layer is seen from above.

10. The method of claim 7, wherein the step includes plural steps, and there is a crossing point at which the plural steps cross each other.

11. The method of claim 7, wherein the first transitional metal oxide and the second transitional metal oxide each comprise an oxide of tantalum, hafnium, or zirconium.

12. The method of claim 7, wherein a diode element is formed in contact with said lower electrode or said upper electrode.

* * * * *